US012751045B2

(12) United States Patent
Peng et al.

(10) Patent No.: US 12,751,045 B2
(45) Date of Patent: Sep. 29, 2026

(54) SEMICONDUCTOR DEVICE COMPRISING CONNECTIONS THROUGH STACKED TRANSISTORS FOR ROUTING FLEXIBILITY

(71) Applicant: TAIWAN SEMICONDUCTOR MANUFACTURING COMPANY LTD., Hsinchu (TW)

(72) Inventors: Shih-Wei Peng, Hsinchu City (TW); Chun-Yen Lin, Hsinchu City (TW); Wei-Cheng Tzeng, Taipei (TW); Jiann-Tyng Tzeng, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 875 days.

(21) Appl. No.: 17/749,160

(22) Filed: May 20, 2022

(65) Prior Publication Data

US 2023/0378288 A1 Nov. 23, 2023

(51) Int. Cl.

| | |
|---|---|
| ***H10D 30/67*** | (2025.01) |
| ***H10D 62/10*** | (2025.01) |
| ***H10D 84/01*** | (2026.01) |
| ***H10D 84/03*** | (2025.01) |
| ***H10D 84/83*** | (2025.01) |

(52) U.S. Cl.
CPC ..... *H10D 30/6729* (2025.01); *H10D 30/6713* (2025.01); *H10D 30/6757* (2025.01); *H10D 62/118* (2025.01); *H10D 84/013* (2025.01); *H10D 84/038* (2025.01); *H10D 84/834* (2025.01)

(58) Field of Classification Search
CPC ........... H10D 30/6729; H10D 30/0198; H10D 64/251; H10D 64/254–256; H10D 64/257; H10D 84/0149; H10D 30/6713
See application file for complete search history.

(56) References Cited

U.S. PATENT DOCUMENTS

| | | | | |
|---|---|---|---|---|
| 10,192,819 B1 * | 1/2019 | Chanemougame | ... | H10W 20/40 |
| 2020/0203382 A1 * | 6/2020 | Jung | .................... | G09G 3/3266 |
| 2021/0265217 A1 | 8/2021 | Peng et al. | | |
| 2023/0197815 A1 * | 6/2023 | Huang | ................. | H10D 30/014 257/288 |

* cited by examiner

*Primary Examiner* — Christine S. Kim
*Assistant Examiner* — Tyler J Wiegand
(74) *Attorney, Agent, or Firm* — WPAT LAW; Anthony King

(57) ABSTRACT

A semiconductor device includes a first transistor, a second transistor, a third transistor, and a contact. The first transistor includes a first source/drain (S/D), a second S/D, and a first gate between the first S/D and the second S/D. The first transistor and the second transistor are stacked over the third transistor. The contact covers the second S/D of the first transistor. The contact is electrically connected to the second transistor and electrically isolated from the second S/D.

20 Claims, 40 Drawing Sheets

SEMICONDUCTOR DEVICE COMPRISING CONNECTIONS THROUGH STACKED TRANSISTORS FOR ROUTING FLEXIBILITY

BACKGROUND

Integrated circuits (ICs) are often designed to implement various devices, including, for example, transistors, resistors, capacitors, or the like. These devices are often designed using connections of conductive traces to form circuits. Increasingly dense ICs result in benefits in terms of speed, functionality and cost, but cause increasingly difficult design and fabrication issues.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
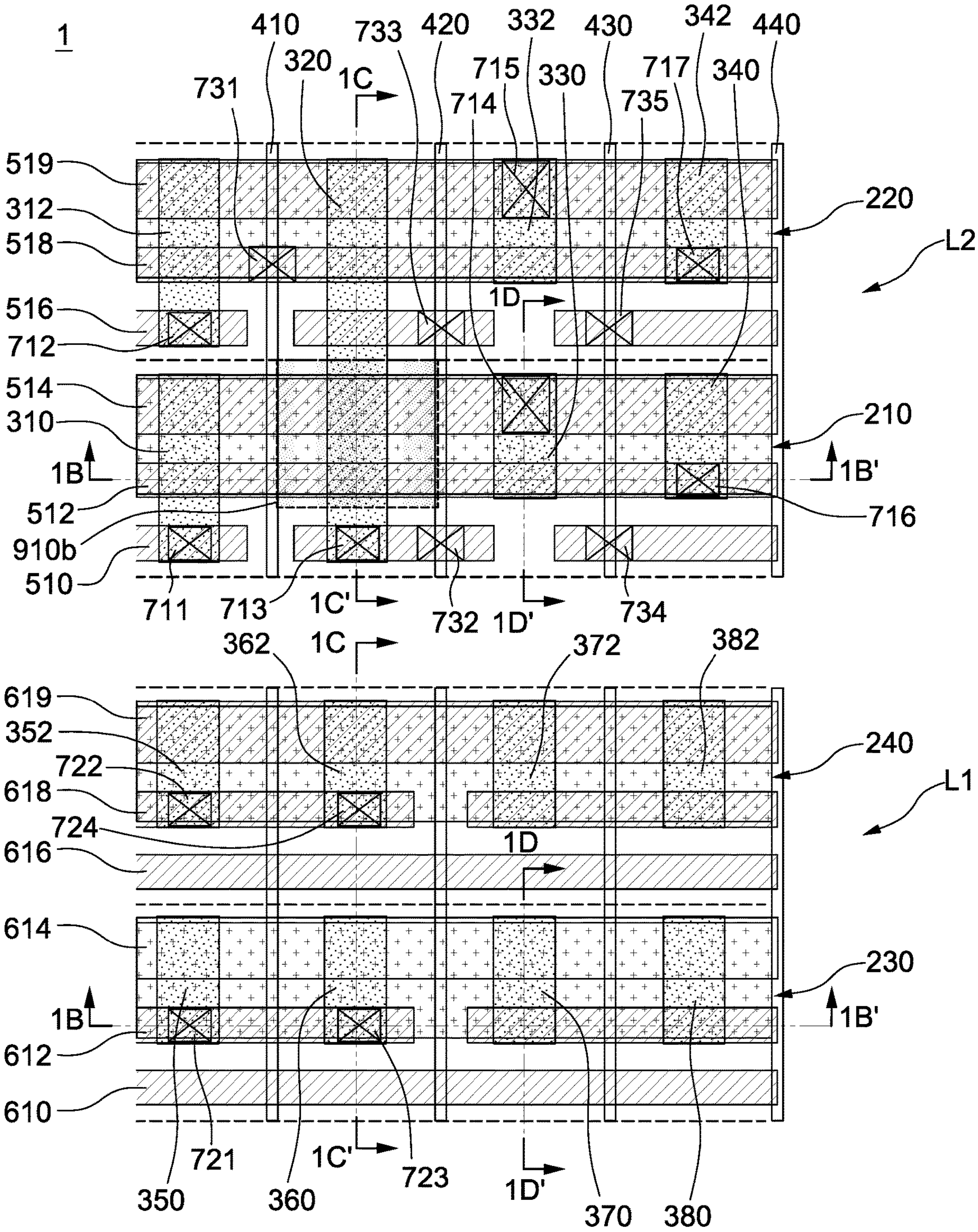
FIG. 1A is a top view of a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" or "substantially" generally mean within 10%, 5%, 1% or 0.5% of a given value or range. Alternatively, the terms "about," "substantial" or "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

Embodiments of the present disclosure discuss semiconductor devices including a contact covering and electrically isolating from a source/drain (S/D) of one transistor while electrically connecting to one or more conductive features of another transistor(s). As such, the contact can serve to electrically connect conductive features of different transistors that are across over one or more gates, offset in an extending direction of the gates, or at different elevations. Therefore, the routing flexibility can be increased, and the number of layers of conductive traces can be reduced.

Figure 1B:
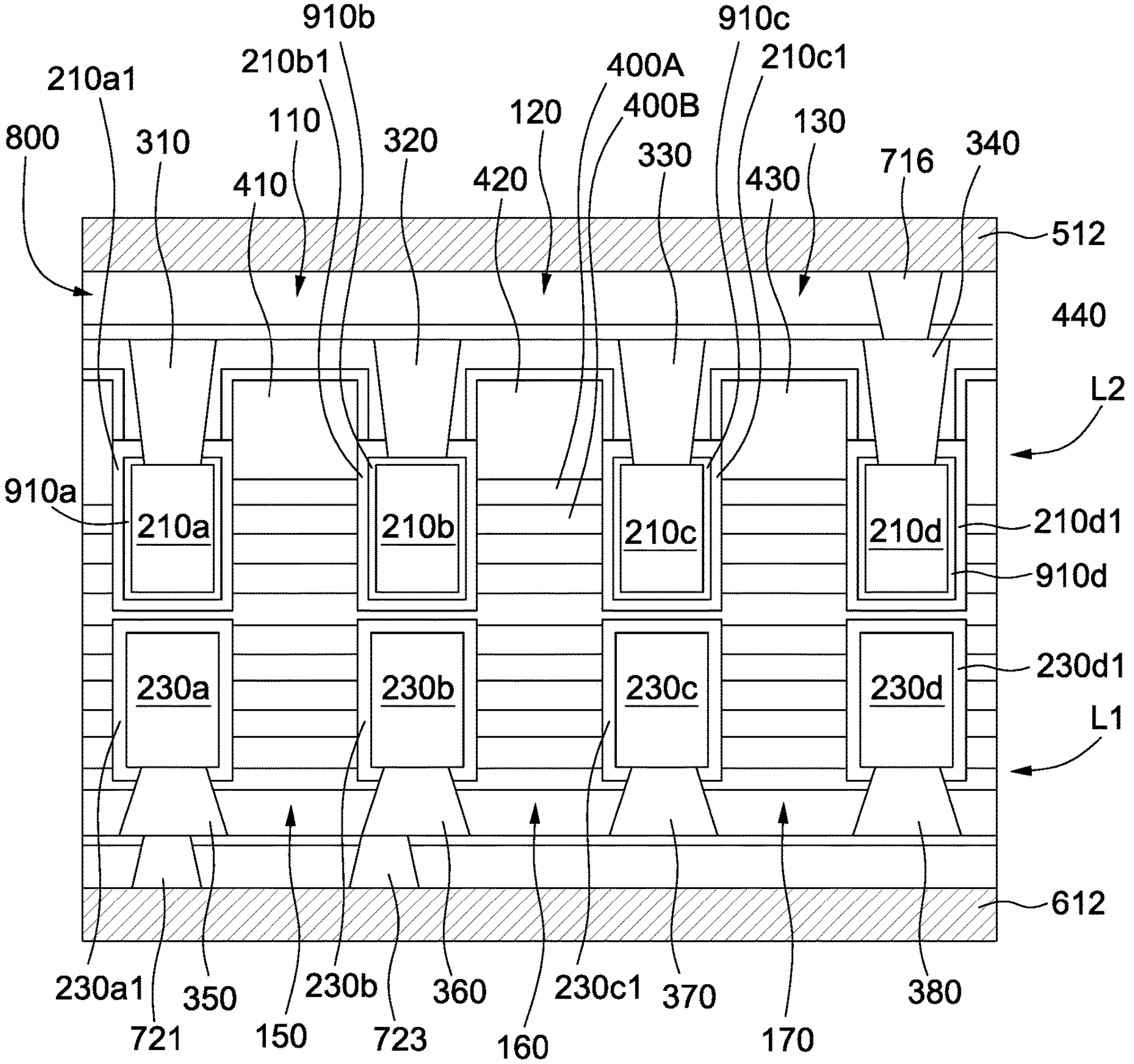
FIG. 1B is a cross-sectional view of a semiconductor device in accordance with some embodiments of the present disclosure.
Figure 1C:
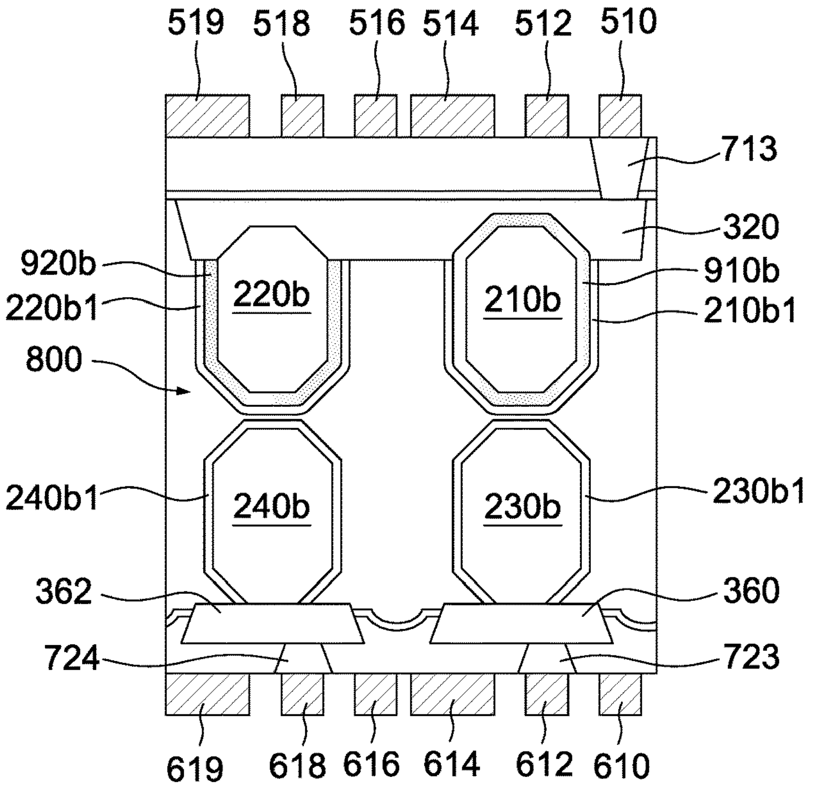
FIG. 1C is a cross-sectional view of a semiconductor device in accordance with some embodiments of the present disclosure.
Figure 1D:
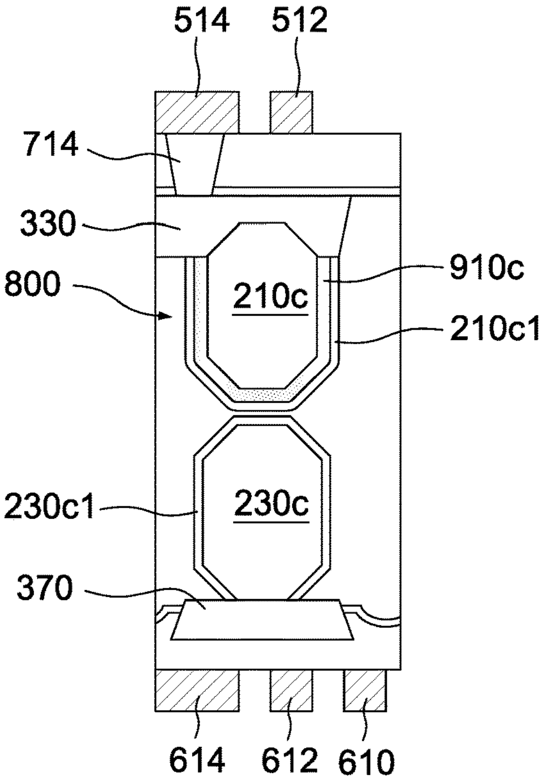
FIG. 1D is a cross-sectional view of a semiconductor device in accordance with some embodiments of the present disclosure.

FIG. 1A is a top view of a semiconductor device 1 in accordance with some embodiments of the present disclosure. FIG. 1B is a cross-sectional view of a semiconductor device 1 in accordance with some embodiments of the present disclosure. FIG. 1C is a cross-sectional view of a semiconductor device 1 in accordance with some embodiments of the present disclosure. FIG. 1D is a cross-sectional view of a semiconductor device 1 in accordance with some embodiments of the present disclosure. In some embodiments, FIG. 1B illustrates a cross-sectional view along the cross-sectional line 1B-1B' in FIG. 1A, FIG. 1C illustrates a cross-sectional view along the cross-sectional line 1C-1C' in FIG. 1A, and FIG. 1D illustrates a cross-sectional view along the cross-sectional line 1D-1D' in FIG. 1A. In some embodiments, FIG. 1A illustrates a top view of a lower layer L1 and a top view of an upper layer L2 of the semiconductor device 1.

Referring to FIGS. 1A-1D, the semiconductor device 1 may be a portion of a standard cell. The semiconductor device 1 may include at least transistors 110, 112, 120, 130, 150, 160, and 170. In some embodiments, the transistors 110, 112, 120, and 130 are stacked over the transistors 150, 160, and 170. The transistors 110, 112, 120, and 130 may have the same conductivity type, and the transistors 150, 160, and 170 may have the same conductivity type. The transistors at the lower layer L1 and the transistors at the upper layer L2 may have opposite conductivity types. In some embodiments, the transistors 110, 112, 120, and 130 are n-type transistors, and the transistors 150, 160, and 170 are p-type transistors, and vice versa.

Referring to FIGS. 1A-1D, the layout structure of the semiconductor device 1 may include active regions 210, 220, 230, and 240, contacts 310, 312, 320, 330, 332, 340, 342, 350, 352, 360, 362, 370, 372, 380, and 382 (also referred to as "source/drain (S/D) contacts"), and gates 410, 420, 430, and 440. Each of the active regions may include conductive segments (e.g., epitaxial structures). For example, the active region 210 may include conductive segments 210*a*, 210*b*, 210*c*, and 210*d*, the active region 220 may include conductive segments 220*a* and 220*b*, the active region 230 may include conductive segments 230*a*, 230*b*, 230*c*, and 230*d*, and the active region 240 may include conductive segments 240*a*, 240*b*, 240*c*, and 240*d*. In some embodiments, each of the conductive segments may include a conductive layer (e.g., an epitaxial layer) and a spacer layer covering the conductive layer. The spacer layer may be or include silicon nitride. For example, the conductive segment 210*a* may include a conductive layer and a spacer layer 210*a*1 covering the conductive layer, the conductive segment 210*b* may include a conductive layer and a spacer layer 210*b*1 covering the conductive layer, the conductive segment 210*c* may include a conductive layer and a spacer layer 210*c*1 covering the conductive layer, the conductive segment 210*d* may include a conductive layer and a spacer layer 210*d*1 covering the conductive layer, the conductive segment 220*b* may include a conductive layer and a spacer layer 220*b*1 covering the conductive layer, the conductive segment 230*a* may include a conductive layer and a spacer layer 230*a*1 covering the conductive layer, the conductive segment 230*b* may include a conductive layer and a spacer layer 230*b*1 covering the conductive layer, the conductive segment 230*c* may include a conductive layer and a spacer layer 230*c*1 covering the conductive layer, the conductive segment 230*d* may include a conductive layer and a spacer layer 230*d*1 covering the conductive layer, and the conductive segment 240*b* may include a conductive layer and a spacer layer 240*b*1 covering the conductive layer.

Referring to FIGS. 1A-1D, the conductive segments of the active regions may serve as source/drains (S/Ds) of the transistors. In some embodiments, the transistor 110 includes the gate 410 and the conductive segments 210*a* and 210*b* on opposite sides of the gate 410. In some embodiments, the transistor 112 includes the gate 410 and the conductive segments 220*a* and 220*b* on opposite sides of the gate 410. In some embodiments, the transistor 120 includes the gate 420 and the conductive segments 210*b* and 210*c* on opposite sides of the gate 420. In some embodiments, the transistor 130 includes the gate 430 and the conductive segments 210*c* and 210*d* on opposite sides of the gate 430. In some embodiments, the transistor 150 includes the gate 410 and the conductive segments 230*a* and 230*b* on opposite sides of the gate 410. In some embodiments, the transistor 160 includes the gate 420 and the conductive segments 230*b* and 230*c* on opposite sides of the gate 420. In some embodiments, the transistor 170 includes the gate 430 and the conductive segments 230*c* and 230*d* on opposite sides of the gate 430. In some embodiments, the gate 440 is a dummy gate. In some other embodiments, the gate 440 is a functional gate of a device adjacent to the cell of the semiconductor device 1.

Referring to FIGS. 1A-1D, the layout structure of the semiconductor device 1 may further include stacked channel structures each including nanosheet channels 400A and 400B. The nanosheet channels 400A and 400B may be epitaxial layers and include Si or SiGe. In some embodiments, the nanosheet channels 400A include Si, and the nanosheet channels 400B include SiGe. Each stack of the nanosheet channels 400A and 400B may be surrounded by a corresponding gate. In some embodiments, each stack of the nanosheet channels 400A and 400B is between adjacent conductive segments at the upper layer L2 and between adjacent conductive segments the lower layer L1. In some embodiments, Si nanosheet channels serve as the channel regions of the n-type transistors, and SiGe nanosheet channels serve as the channel regions of the p-type transistors.

Referring to FIGS. 1A-1D, the layout structure of the semiconductor device 1 may further include conductive traces 510, 512, 514, 516, 518, 519, 610, 612, 614, 616, 618, and 619, conductive vias 711, 712, 713, 714, 715, 716, 721, 722, 723, 724, 731, 732, 733, 734, and 735, and an insulation structure 800. In some embodiments, the conductive traces 510, 512, 514, 516, 518, and 519 are over and electrically connected to the transistors 110, 112, 120, and 130 at the upper layer L2, and the conductive traces 610, 612, 614, 616, 618, and 619 are under and electrically connected to the transistors 150, 160, and 170 at the lower layer L1. In some embodiments, the conductive vias 711, 712, 713, 714, 715, and 716 serve to electrically connect the S/D contacts (e.g., the contacts 310, 312, 320, 330, 332, 340, and 342) at the upper layer L2 to the conductive traces over the upper layer L2. In some embodiments, the conductive vias 721, 722, 723, and 724 serve to electrically connect the S/D contacts (e.g., the contacts 350, 352, 360, 362, 370, 372, 380, and 382) at the lower layer L1 to the conductive traces under the lower layer L1. In some embodiments, the conductive vias 731, 732, 733, 734, and 735 serve to electrically connect the gates to the conductive traces over the upper layer L2. In some embodiments, the insulation structure 800 covers the transistors, the S/D contacts, and the conductive vias. The insulation structure 800 may include a plurality of insulating layers, e.g., dielectric layers.

Referring to FIGS. 1A-1D, the layout structure of the semiconductor device 1 may further include at least isolation layers 910*a*, 910*b*, 910*c*, 910*d*, and 920*b*. In some embodiments, each of the isolation layers covers a corresponding conductive segment at the upper layer L2. For example, the isolation layer 910*a* may cover the conductive segment 210*a*, the isolation layer 910*b* may cover the conductive segment 210*b*, the isolation layer 910*c* may cover the conductive segment 210*c*, the isolation layer 910*d* may cover the conductive segment 210*d*, and the isolation layer 920*b* may cover the conductive segment 220*b*.

Referring to FIGS. 1A-1D, in some embodiments, the contact 320 covers and is electrically isolated from the conductive segment (or the S/D) 210*b* of the transistor 110, and the contact 320 is electrically connected to the transistor 120. In some embodiments, the contact 320 is electrically connected to the gate 420 of the transistor 120 through the conductive via 713, the conductive trace 510, and the conductive via 734. In some embodiments, the isolation layer 920*b* covers a surface of the conductive segment 210*b* and electrically isolates the contact 320 from the conductive segment 210*b*. In some embodiments, the isolation layer 920*b* is between and directly contacts the contact 320 and the conductive segment (or the S/D) 210*b* of the transistor 110.

Referring to FIGS. 1A-1D, in some embodiments, the contact 320 is electrically connected to transistor 112. In some embodiments, the contact 320 further covers the conductive segment (or the S/D) 220*b* of the transistor 112. In some embodiments, the contact 320 is electrically connected to the conductive segment (or the S/D) 220*b* of the transistor 112. In some embodiments, the isolation layer 920*b* has an opening exposing a portion of the conductive segment 220*b* which contacts and electrically connects to the contact 320. In some embodiments, the transistor 112 is offset from the transistor 120 in an extending direction of the gates, and the transistor 112 is electrically connected to the transistor 120 through the contact 320. In some embodiments, the conductive segment (or the S/D) 220*b* of the transistor 112 is electrically connected to the gate 420 of the transistor 120 through the contact 320, the conductive via 713, the conductive trace 510, and the conductive via 734.

In some embodiments, the conductive segment 210*b* is an internal common S/D or a shared S/D between different transistors. In some embodiments, the transistor 110 and the transistor 120 share the conductive segment 210*b* as a shared S/D. In some embodiments, the isolation layer 920*b* covers the conductive segment 210*b* (or the shared S/D), and the conductive segment 210*b* (or the shared S/D) is electrically isolated from an external connector. That is, there is not external connector electrically connected to the conductive segment 210*b*.

According to some embodiments of the present disclosure, with the aforesaid design, the contact 320 can extend over the conductive segment 210*b* to further electrically connect to conductive features in other transistors without arranging additional stacked conductive traces or vias. For example, the contact 320 can serve to electrically connect conductive features of two transistors that are across over one or more gates or that are offset in an extending direction of the gates. Therefore, the routing flexibility can be increased, and the number of layers of conductive traces can be reduced.

FIGS. 2A to 9D are schematic views of intermediate stages of a method of manufacturing a semiconductor device 1B in accordance with some embodiments of the present disclosure.

Figure 2A:
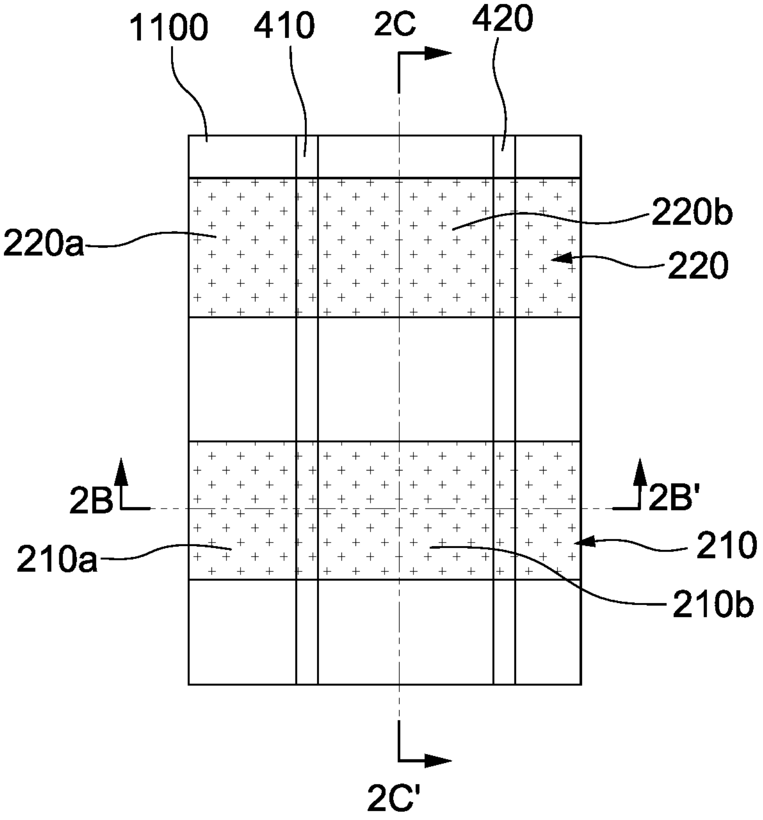
FIGS. 2A to 9D are schematic views of intermediate stages of a method of manufacturing a semiconductor device in accordance with some embodiments of the present disclosure.
Figure 2B:
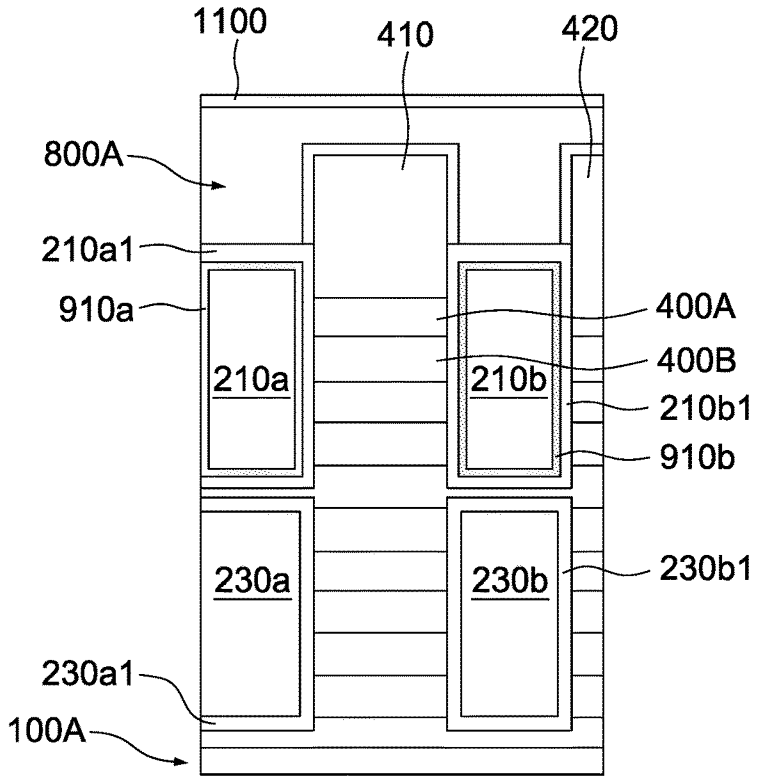
Figure 2C:
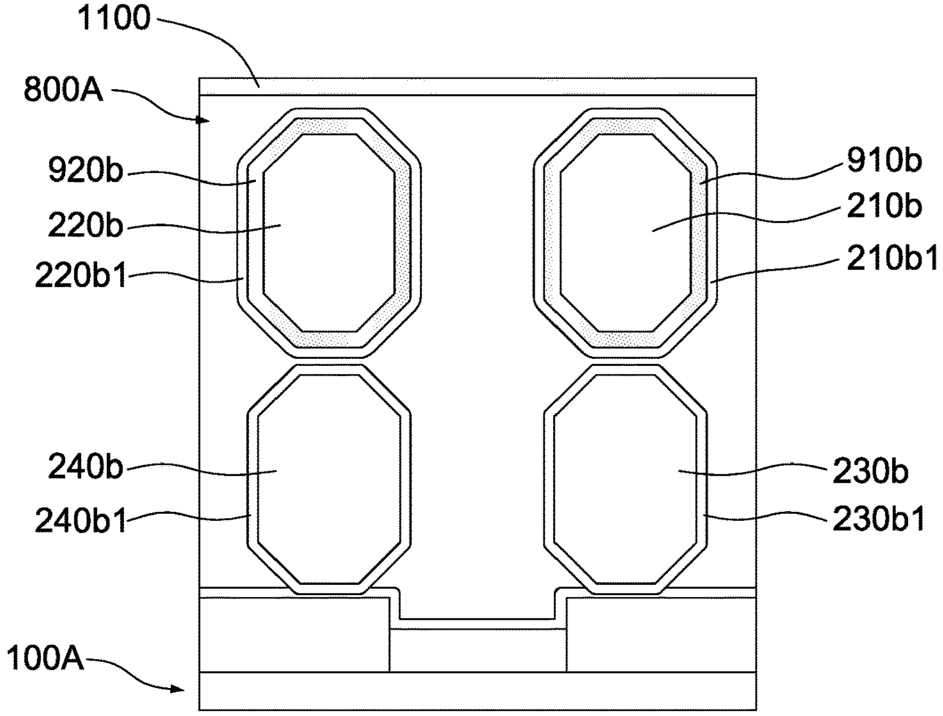

Referring to FIGS. 2A-2C, FIG. 2B illustrates a cross-sectional view along the cross-sectional line 2B-2B' in FIG. 2A, and FIG. 2C illustrates a cross-sectional view along the cross-sectional line 2C-2C' in FIG. 2A. In some embodiments, stacks of nanosheet channels 400A and 400B are formed over a substrate 100A, conductive segments 230*a* and 230*b* are formed on opposite sides of a stack of nanosheet channels 400A and 400B, and a conductive segment 240*b* is formed adjacent to the conductive segment 230*b*. In some embodiments, conductive segments 210*a* and 210*b* are formed over the conductive segments 230*a* and 230*b* and on opposite sides of the stack of nanosheet channels 400A and 400B, and a conductive segment 220*b* is formed over the conductive segment 240*b*. In some embodiments, gates 410 and 420 are formed on the stacks of nanosheet channels 400A and 400B, and an insulation structure 800A is formed covering the conductive segments 210*a*, 210*b*, 220*a*, 220*b*, 230*a*, 230*b*, and 240*b*, the nanosheet channels 400A and 400B, and the gates 410 and 420, and a hardmask 1100 is formed on the insulation structure 800A. In some embodiments, the insulation structure 800A includes an oxide layer, and the hardmask 1100 include silicon nitride. The substrate 100A may include a silicon layer over a buried oxide layer.

In some embodiments, the conductive segment 210*a* includes a conductive layer, an isolation layer 910*a* covering the conductive layer, and a spacer layer 210*a*1 covering the isolation layer 910*a*. In some embodiments, the conductive segment 210*b* includes a conductive layer, an isolation layer 910*b* covering the conductive layer, and a spacer layer 210*b*1 covering the isolation layer 910*b*. In some embodiments, the conductive segment 220*b* includes a conductive layer, an isolation layer 920*b* covering the conductive layer, and a spacer layer 220*b*1 covering the isolation layer 920*b*.

Figure 3A:
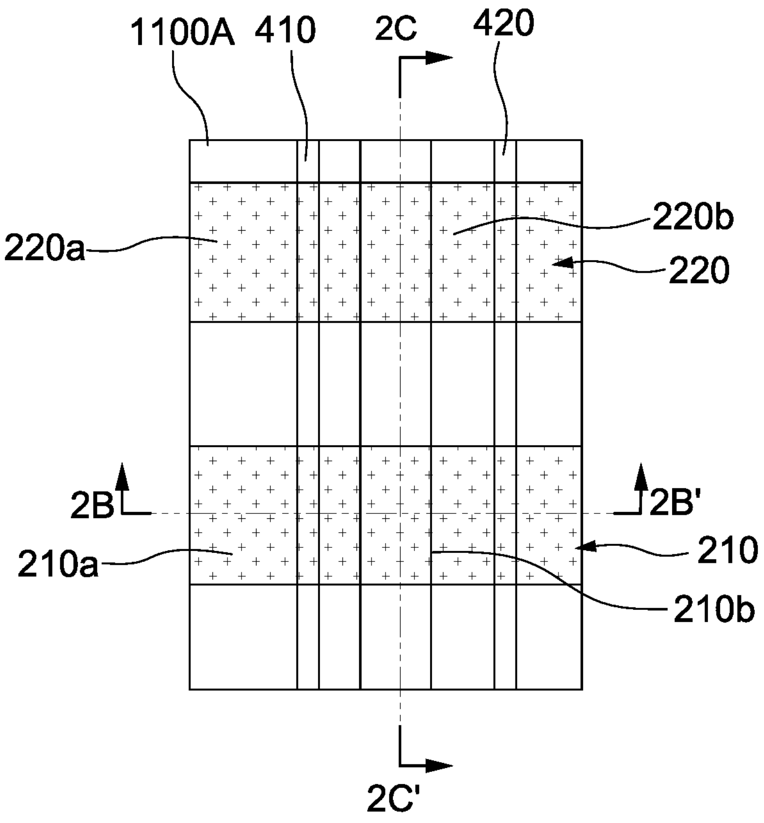
Figure 3B:
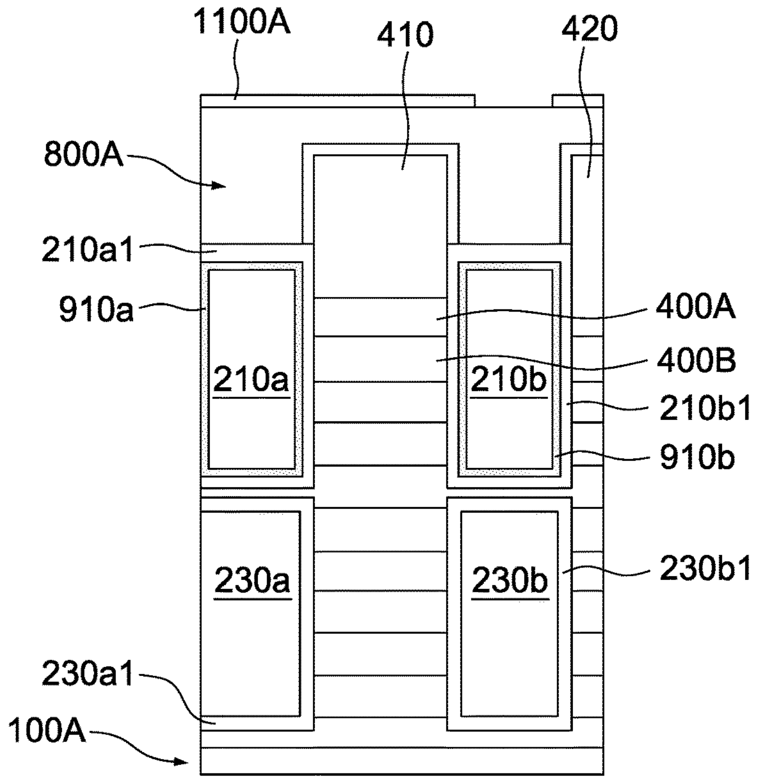
Figure 3C:
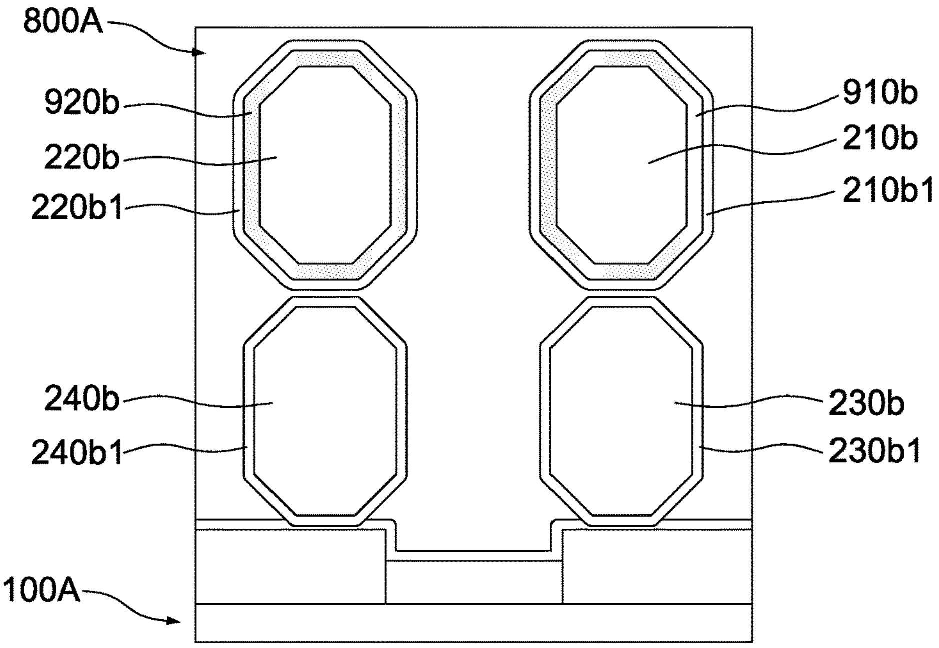

Referring to FIGS. 3A-3C, FIG. 3B illustrates a cross-sectional view along the cross-sectional line 2B-2B' in FIG. 3A, and FIG. 3C illustrates a cross-sectional view along the cross-sectional line 2C-2C' in FIG. 3A. In some embodiments, a patterning operation is performed on the hardmask 1100A to form a patterned hardmask 1100A having an opening exposing a portion of the insulation structure 800A. In some embodiments, the opening is directly above the conductive segments 210*b* and 220*b*. The patterning operation may be performed by etching.

Figure 4A:
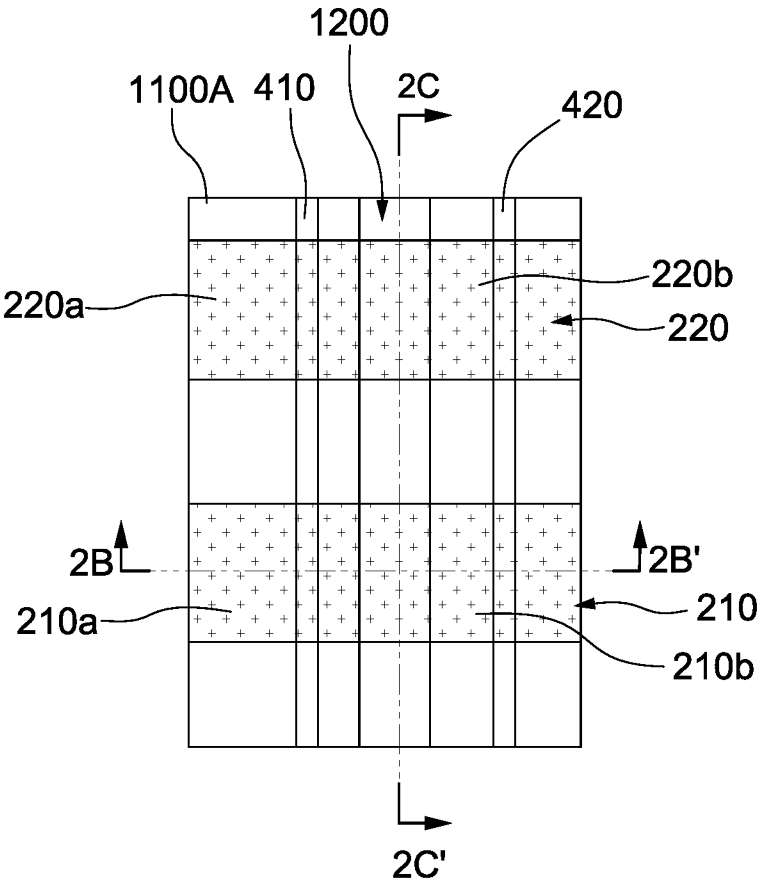
Figure 4B:
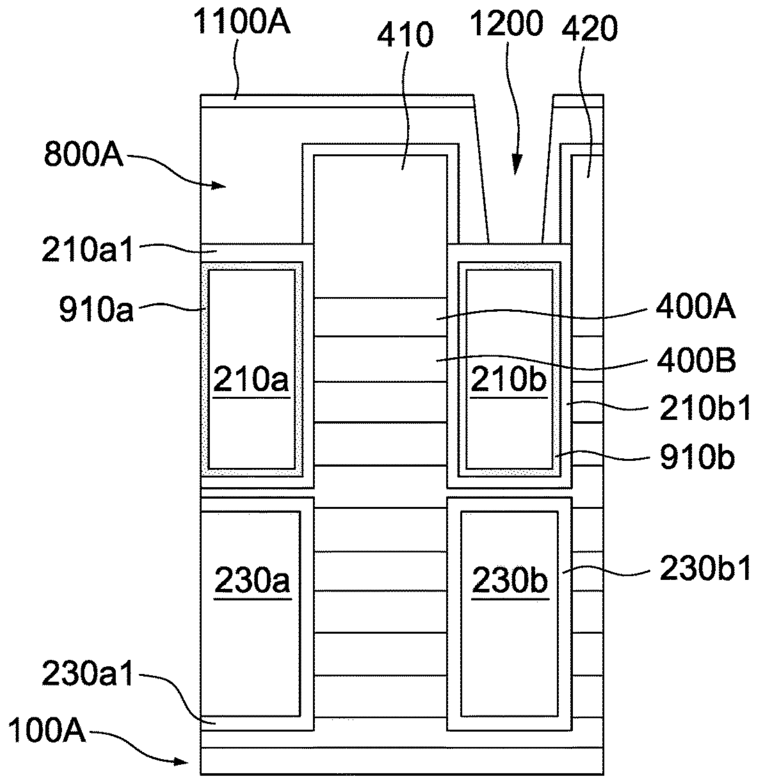
Figure 4C:
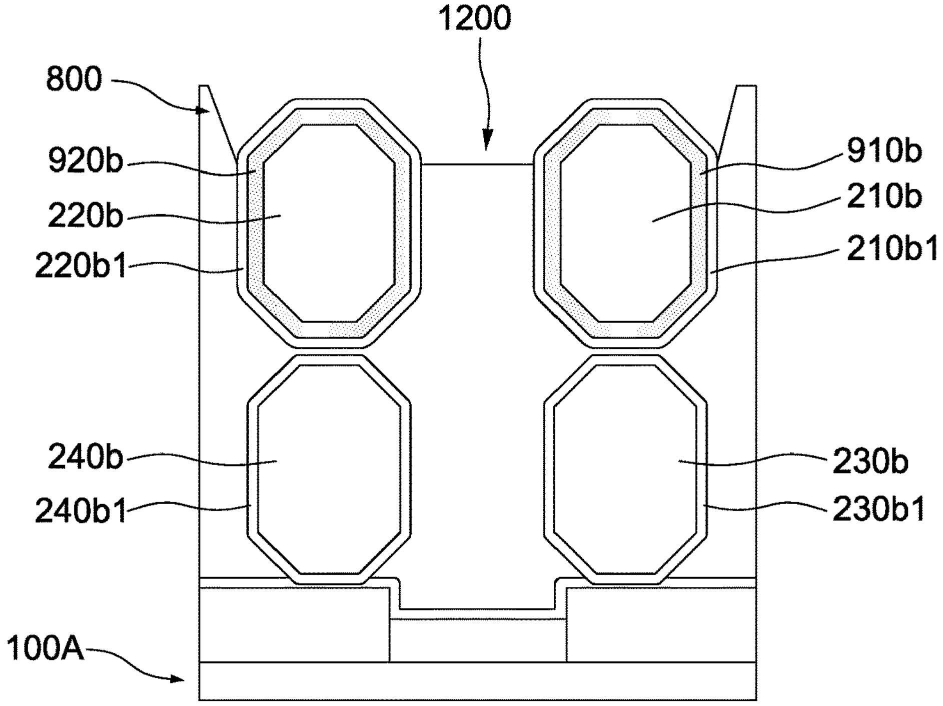

Referring to FIGS. 4A-4C, FIG. 4B illustrates a cross-sectional view along the cross-sectional line 2B-2B' in FIG. 4A, and FIG. 4C illustrates a cross-sectional view along the cross-sectional line 2C-2C' in FIG. 4A. In some embodiments, a trench 1200 may be formed passing through the insulation structure 800A and stopped at the spacer layer 210*b*1 of the conductive segment 210*b* and the spacer layer 220*b*1 of the conductive segment 220*b*. The trench 1200 may be formed by etching according to the opening of the patterned hardmask 1100A.

Figure 5A:
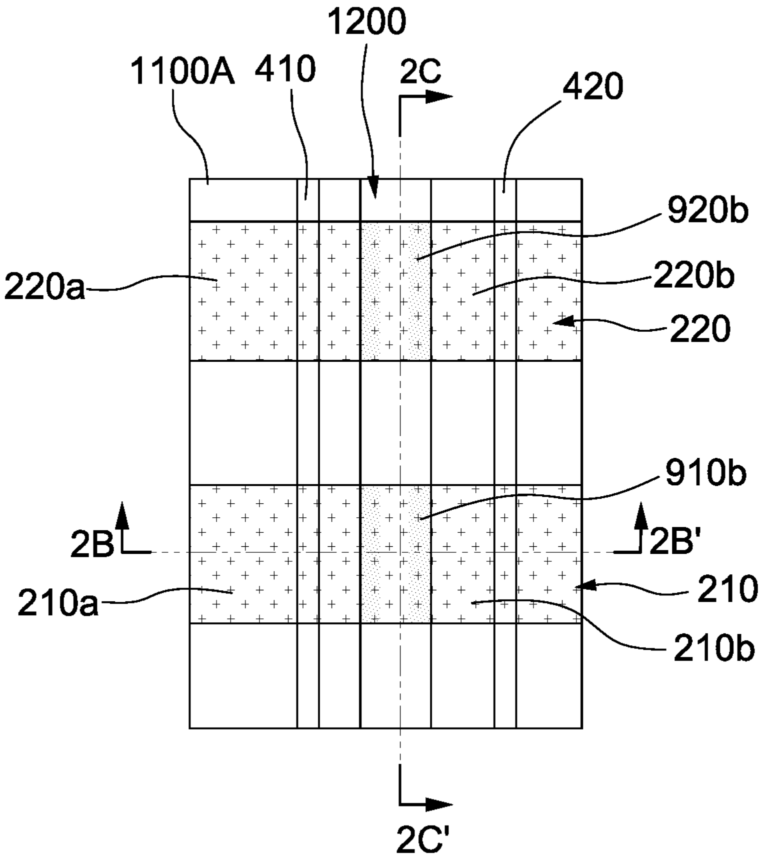
Figure 5B:
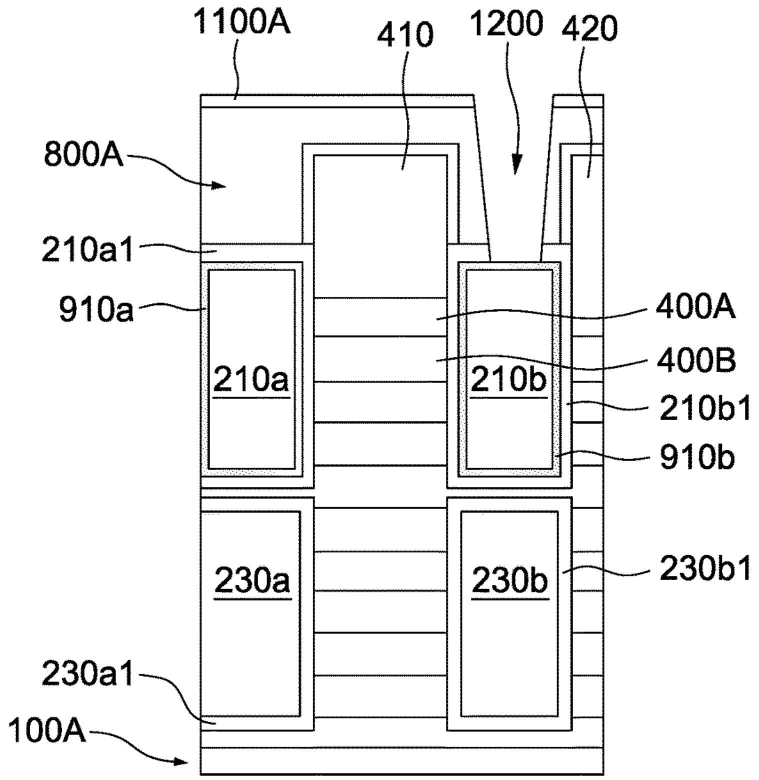
Figure 5C:
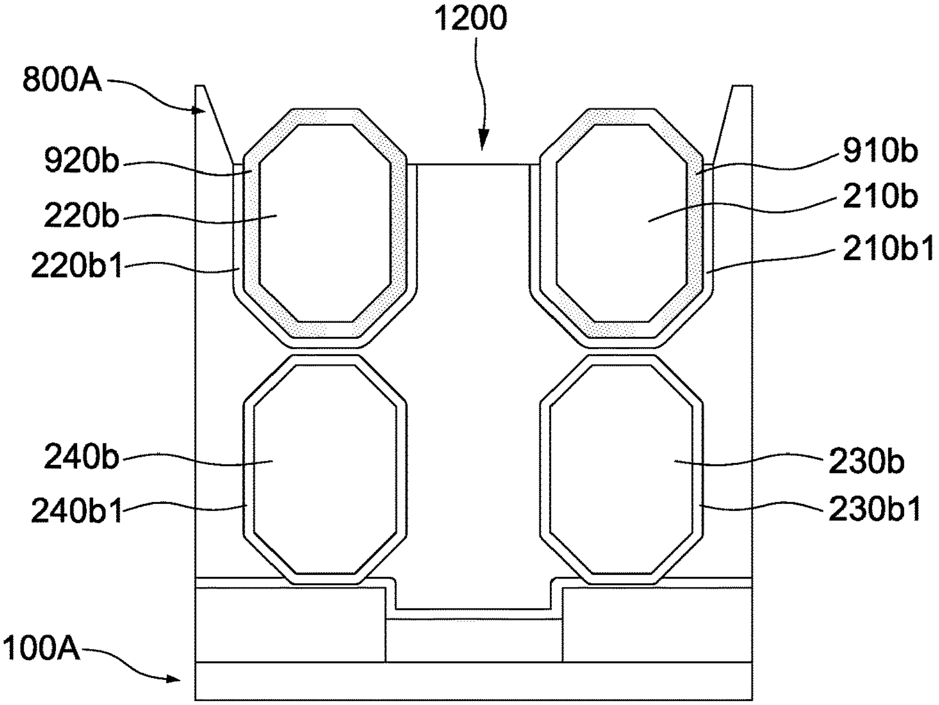

Referring to FIGS. 5A-5C, FIG. 5B illustrates a cross-sectional view along the cross-sectional line 2B-2B' in FIG. 5A, and FIG. 5C illustrates a cross-sectional view along the cross-sectional line 2C-2C' in FIG. 5A. In some embodiments, portions of the spacer layers 210*b*1 and 220*b*1 exposed to the trench 1200 are removed to exposed portions of the isolation layers 910*b* and 920*b*. The portions of the spacer layers 210*b*1 and 220*b*1 may be removed by etching.

Figure 6A:
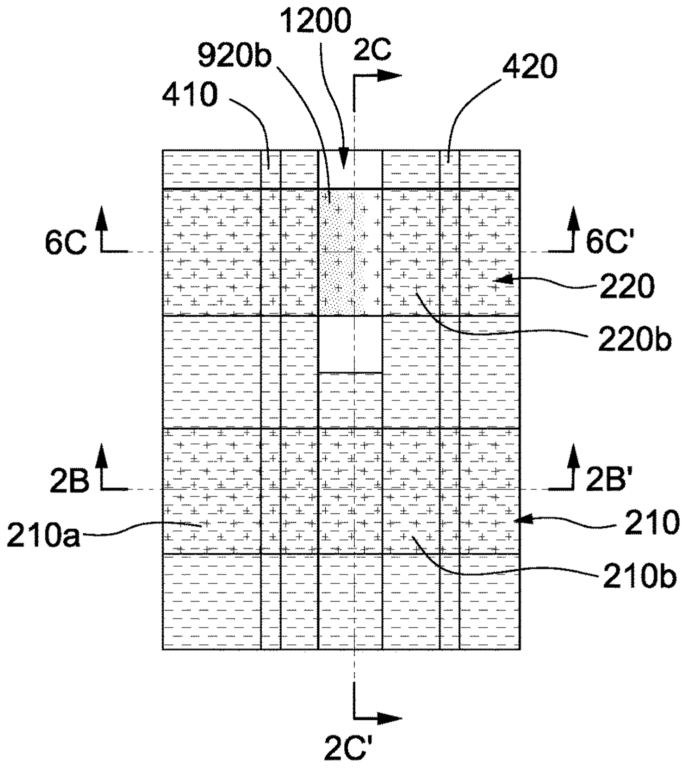
Figure 6B:
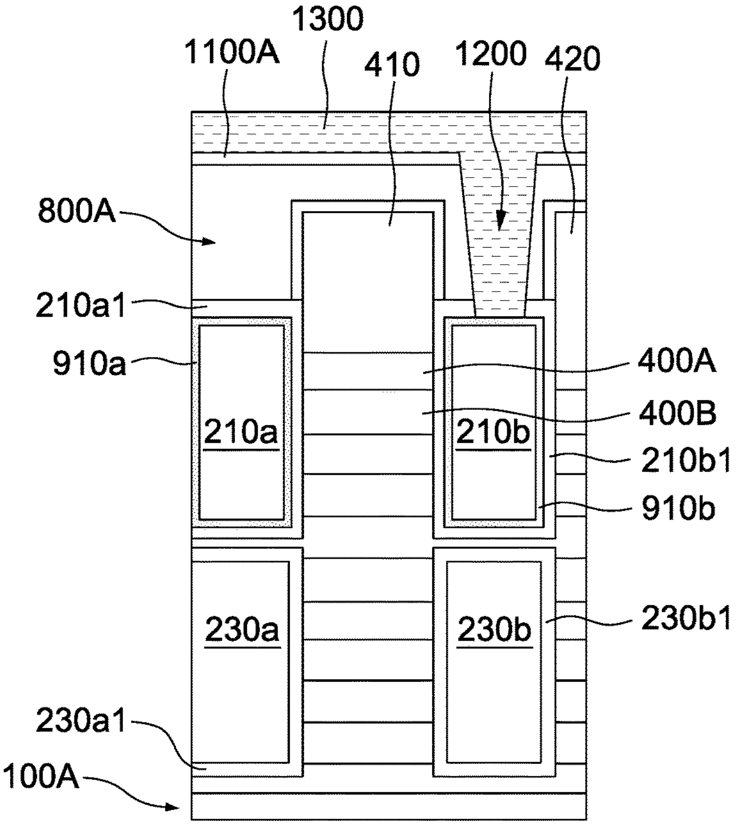
Figure 6C:
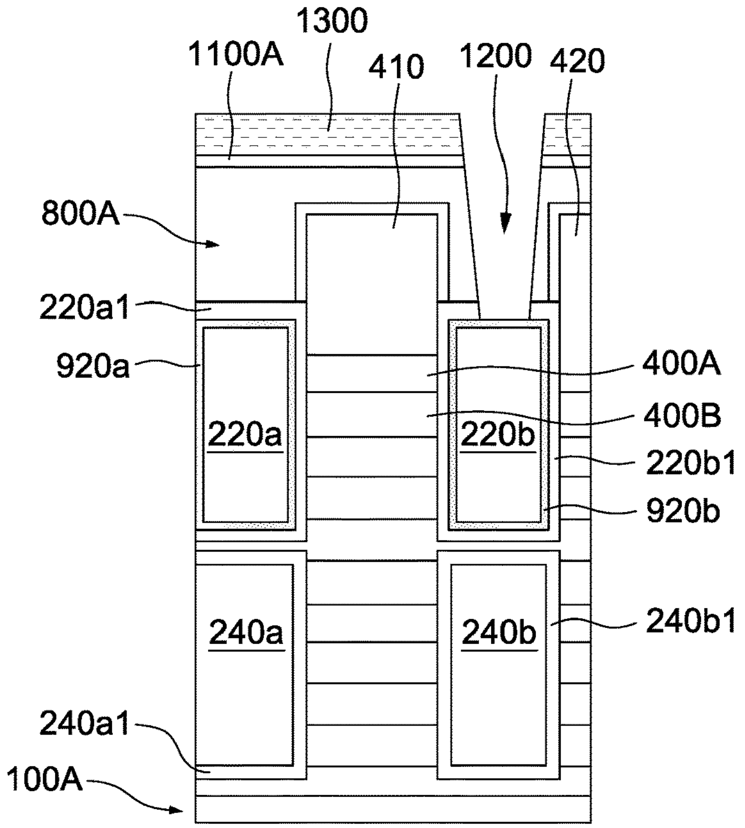
Figure 6D:
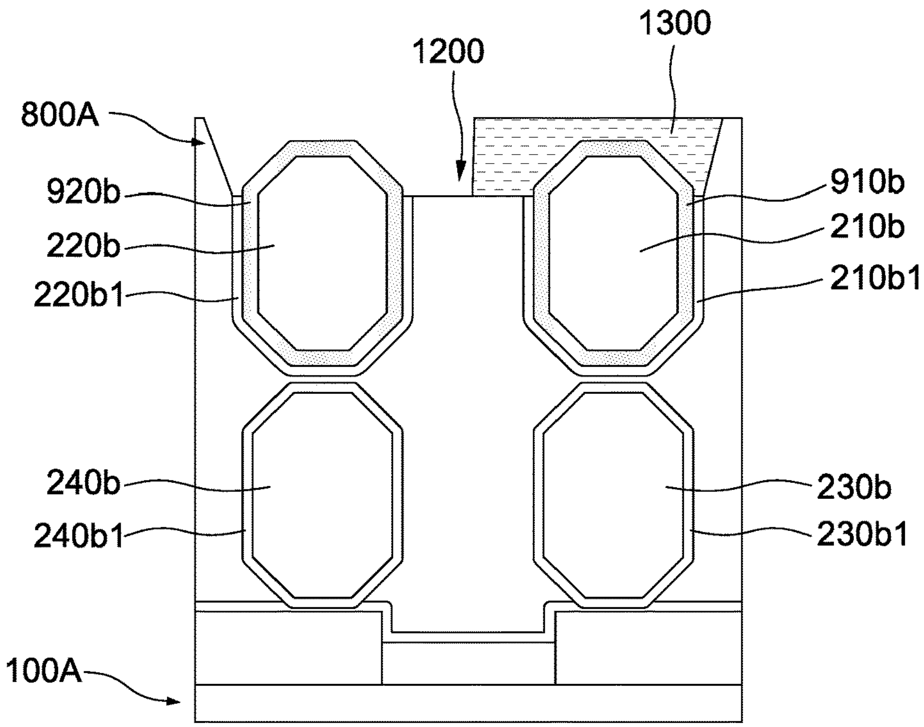

Referring to FIGS. 6A-6D, FIG. 6B illustrates a cross-sectional view along the cross-sectional line 2B-2B' in FIG. 6A, FIG. 6C illustrates a cross-sectional view along the cross-sectional line 6C-6C' in FIG. 6A, and FIG. 6D illustrates a cross-sectional view along the cross-sectional line 2C-2C' in FIG. 6A. In some embodiments, a protection layer 1300 is formed on the exposed portion of the isolation layer 910*b* in the trench 1200. In some embodiments, the protection layer 1300 entirely covers the exposed portion of the isolation layer 910*b* in the trench 1200. In some embodiments, the protection layer 1300 is free from covering or contacting the exposed portion of the isolation layer 920*b*. In some embodiments, the exposed portion of the isolation layer 920*b* is exposed to the trench 1200 by the protection layer 1300.

Figure 7A:
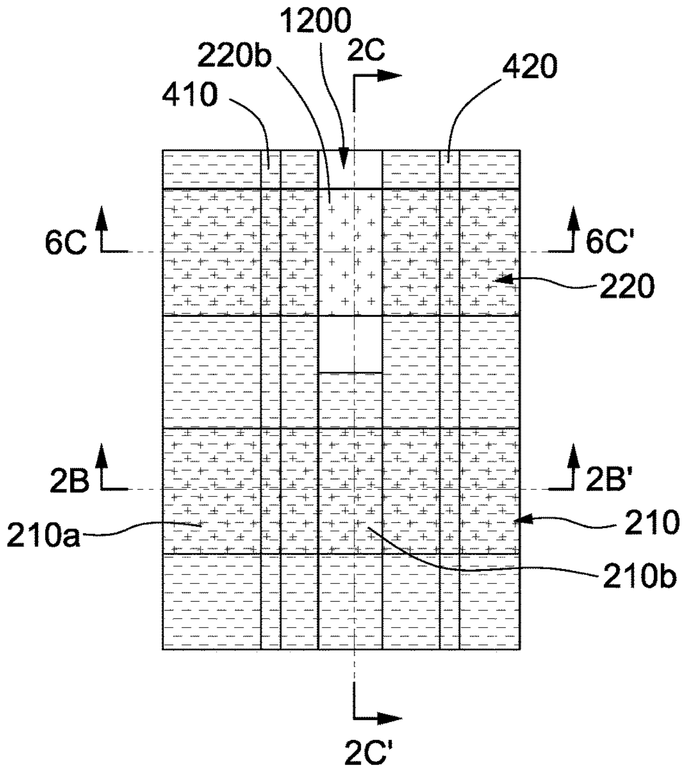
Figure 7B:
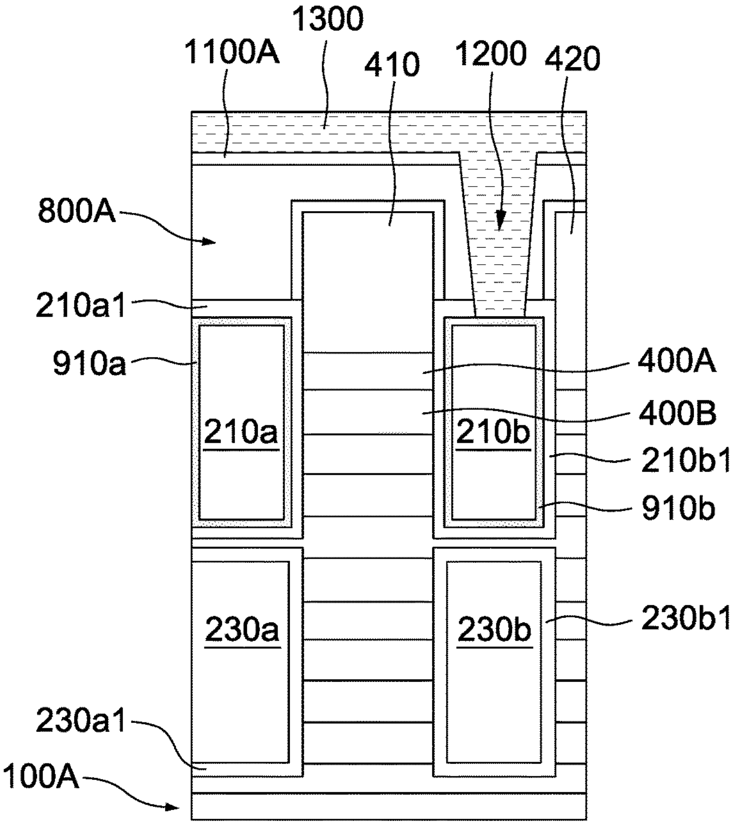
Figure 7C:
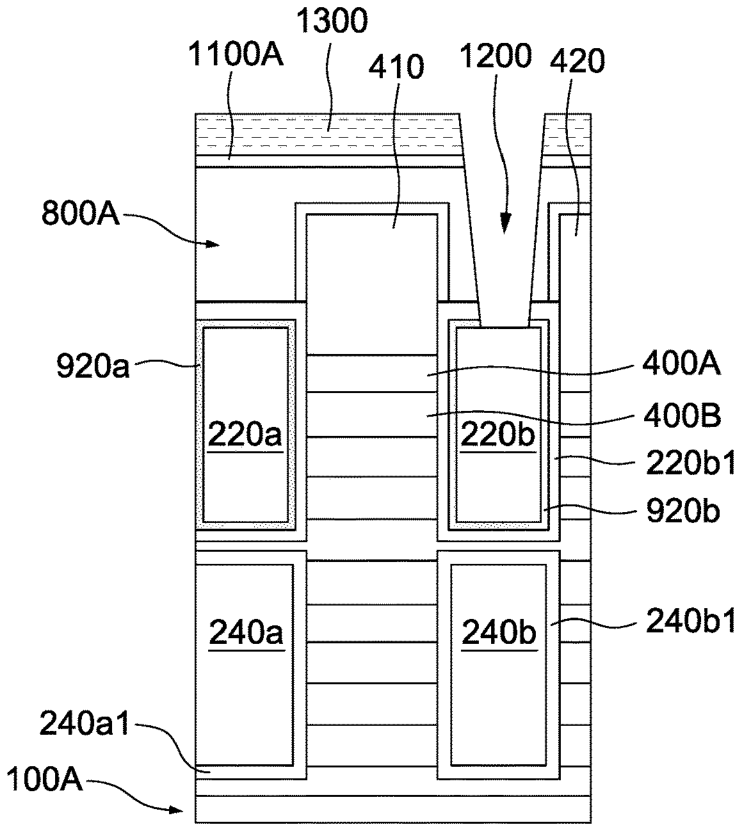
Figure 7D:
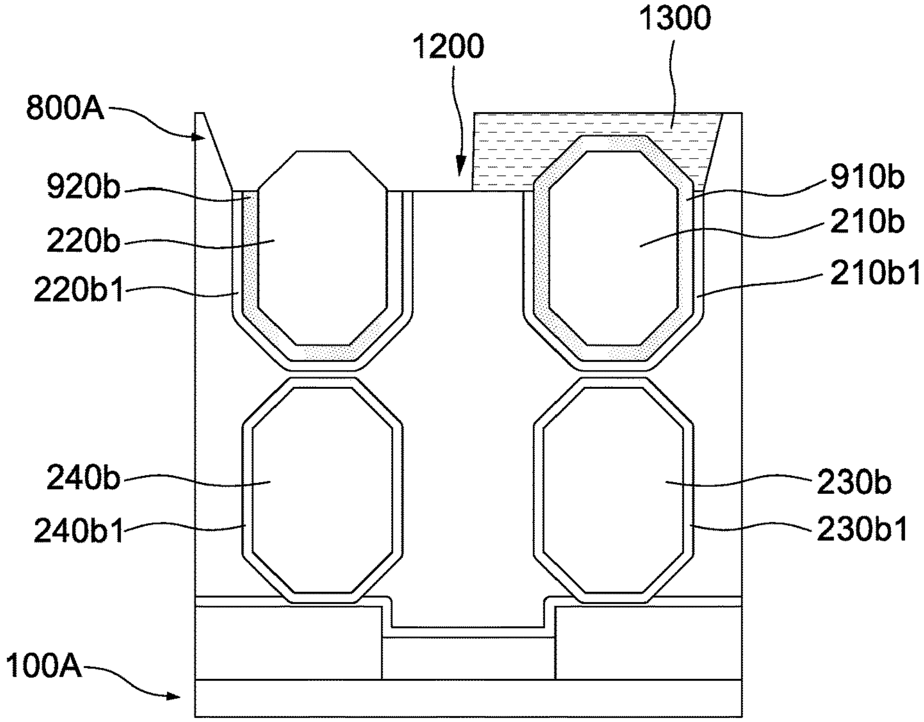

Referring to FIGS. 7A-7D, FIG. 7B illustrates a cross-sectional view along the cross-sectional line 2B-2B' in FIG. 7A, FIG. 7C illustrates a cross-sectional view along the cross-sectional line 6C-6C' in FIG. 7A, and FIG. 7D illustrates a cross-sectional view along the cross-sectional line 2C-2C' in FIG. 7A. In some embodiments, the exposed portion of the isolation layer 920*b* is removed to expose a portion of the conductive layer of the conductive segment 220*b*. The exposed portion of the isolation layer 920*b* may be removed by etching.

Figure 8A:
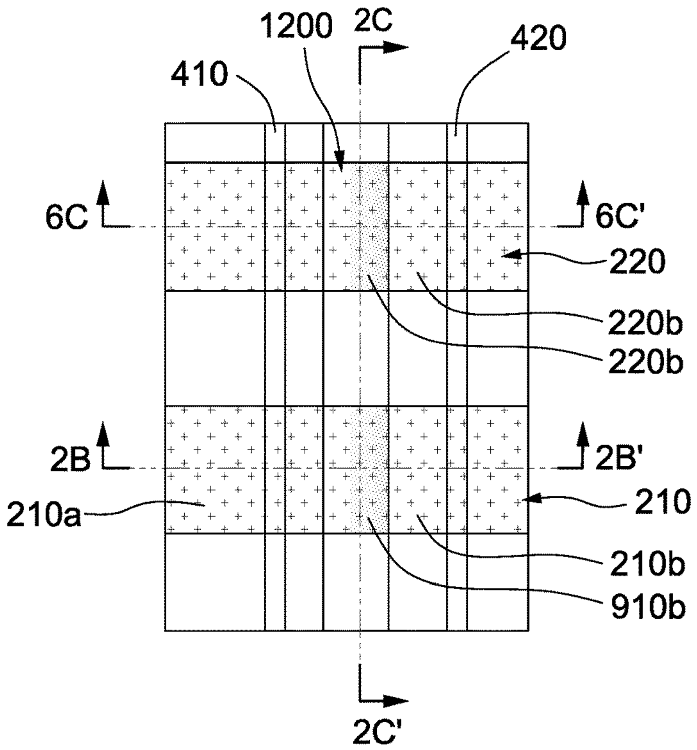
Figure 8B:
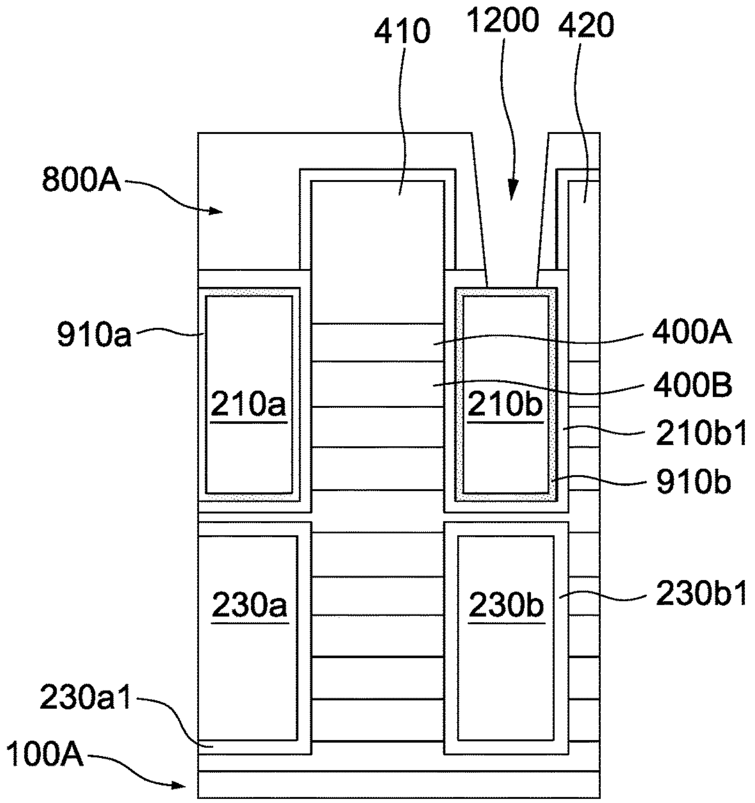
Figure 8C:
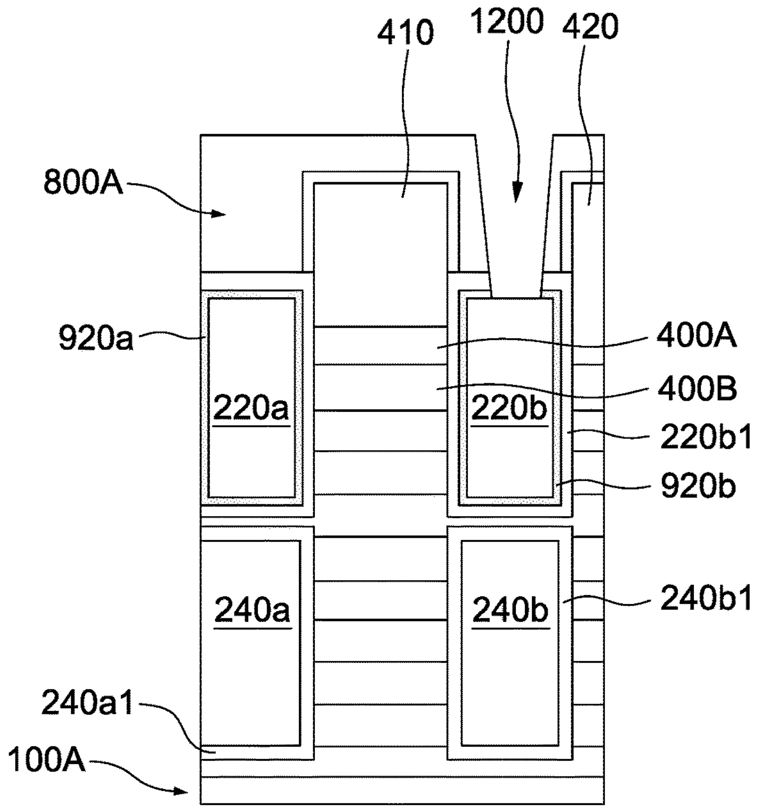
Figure 8D:
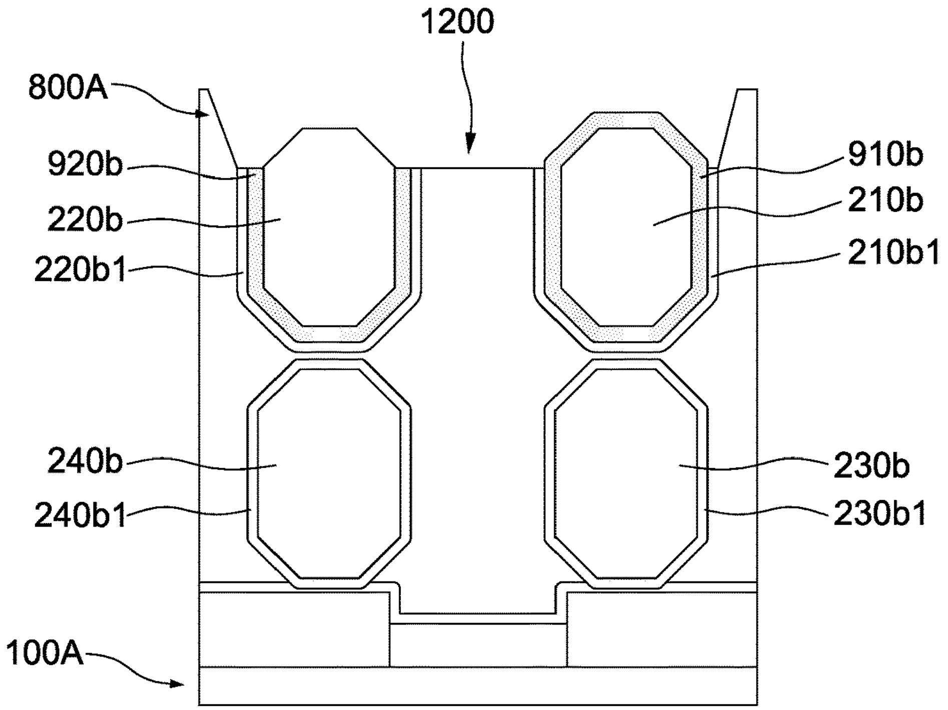

Referring to FIGS. 8A-8D, FIG. 8B illustrates a cross-sectional view along the cross-sectional line 2B-2B' in FIG. 8A, FIG. 8C illustrates a cross-sectional view along the cross-sectional line 6C-6C' in FIG. 8A, and FIG. 8D illustrates a cross-sectional view along the cross-sectional line 2C-2C' in FIG. 8A. In some embodiments, the protection layer 1300 is removed. In some embodiments, a portion of the conductive layer of the conductive segment 220*b* is exposed to the trench 1200, and the conductive layer of the conductive segment 210*b* remains entirely covered by the isolation layer 910*b*.

Figure 9A:
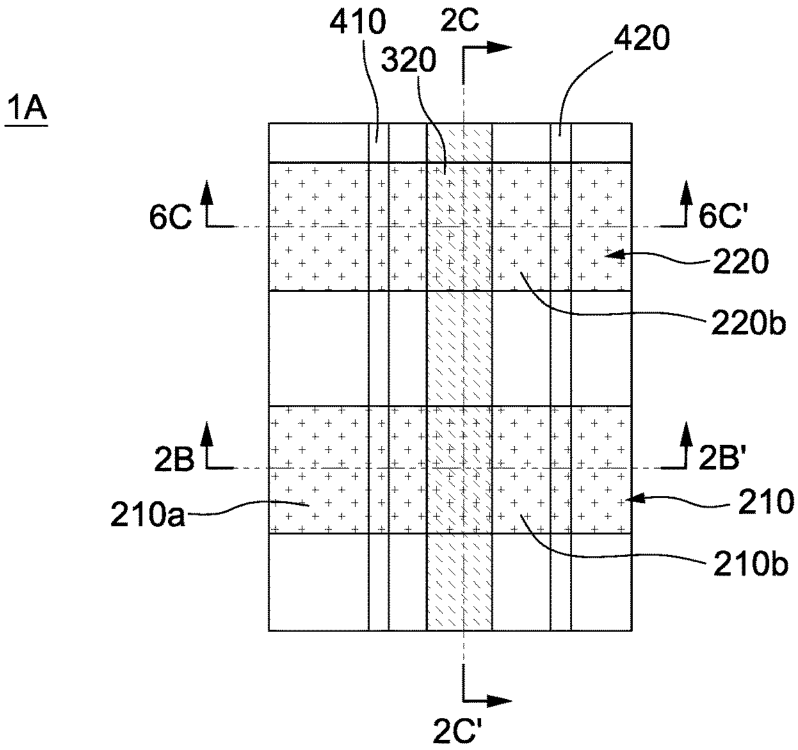
Figure 9B:
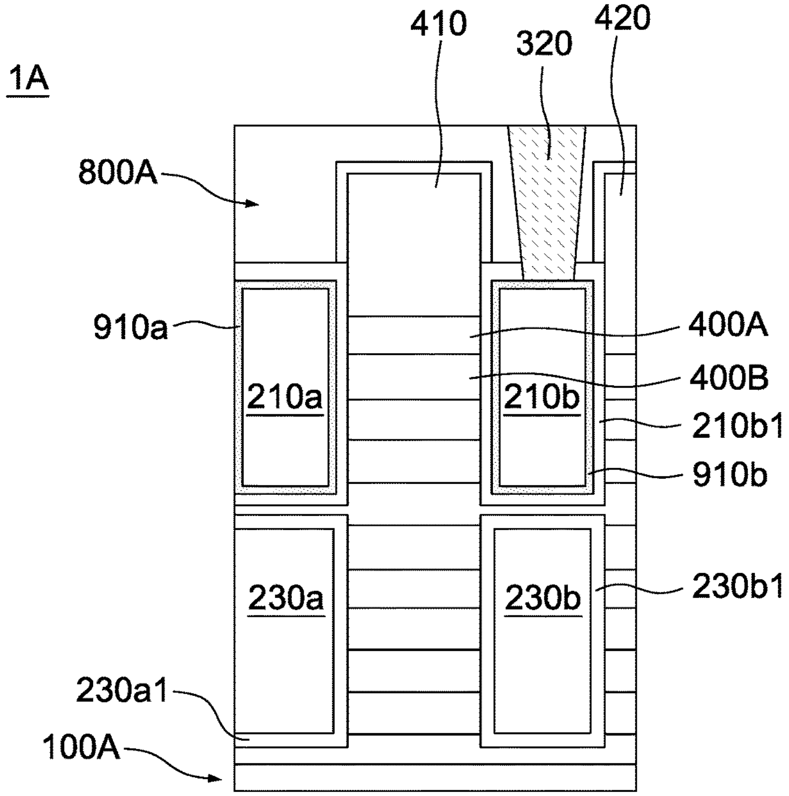
Figure 9C:
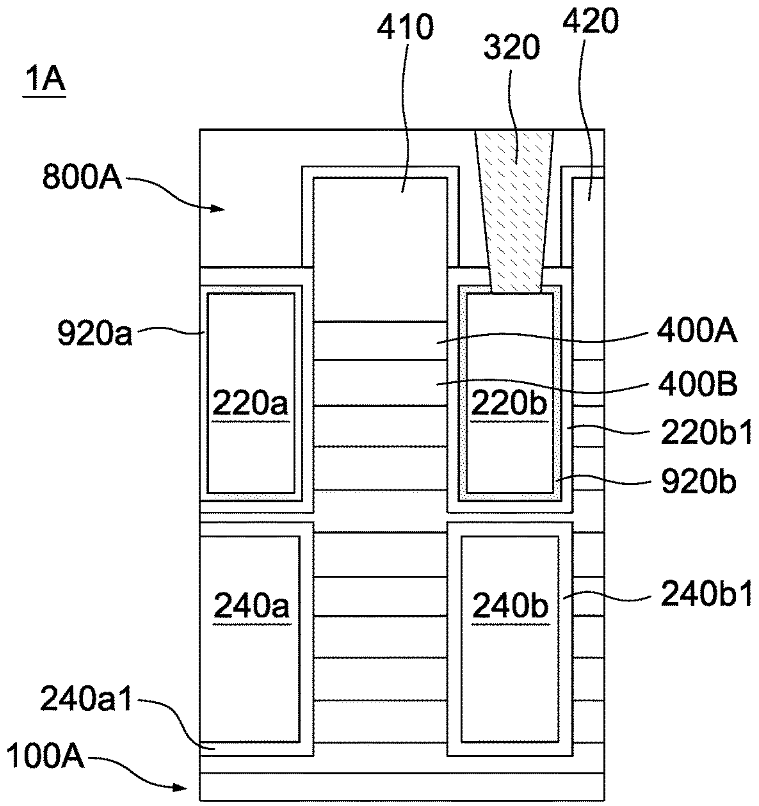
Figure 9D:
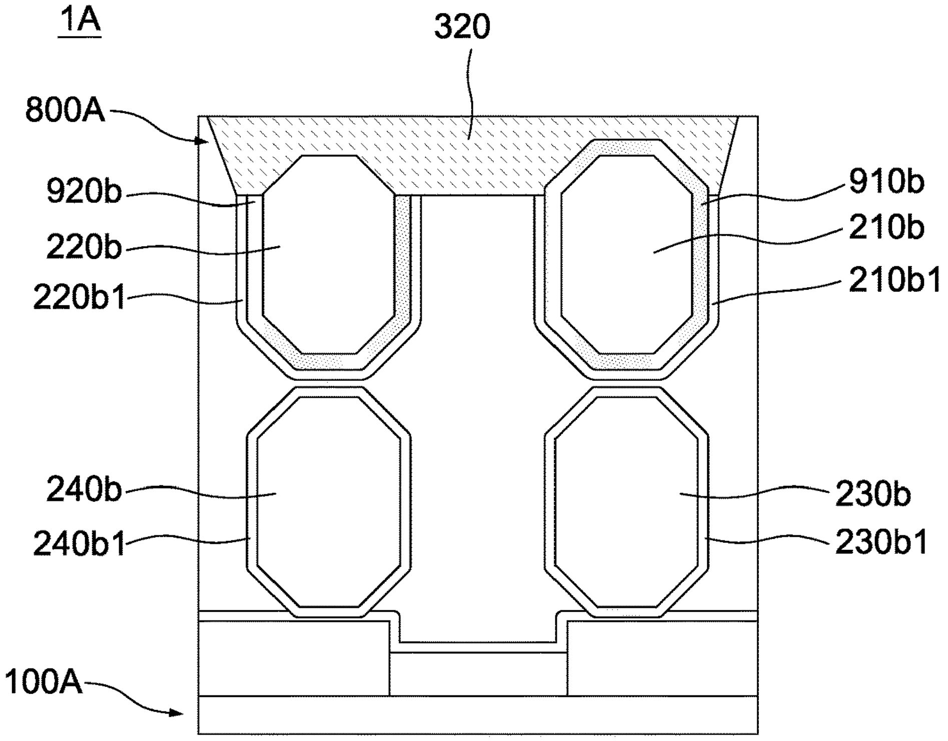

Referring to FIGS. 9A-9D, FIG. 9B illustrates a cross-sectional view along the cross-sectional line 2B-2B' in FIG. 9A, FIG. 9C illustrates a cross-sectional view along the cross-sectional line 6C-6C' in FIG. 9A, and FIG. 9D illustrates a cross-sectional view along the cross-sectional line 2C-2C' in FIG. 9A. In some embodiments, a conductive material is formed in the trench 1200 to form a contact 320 extending on the conductive segments 210*b* and 220*b*. The conductive material may be formed by deposition. As such, a semiconductor device 1A is formed.

In some embodiments, further referring to FIG. 1C, one or more dielectric materials may be formed over the contact 320 which together with the insulation structure 800A may form an insulation structure 800, a conductive via 713 may be formed passing the insulation structure 800 to electrically connect to the contact 320, and conductive traces 510, 512, 514, 516, 518, and 519 may be formed over the conductive segments 210*b* and 220*b*. Next, the as-formed structure may be flipped over by 180°, contacts 360 and 362 may be formed on the conductive segments 230*b* and 240*b*, conductive vias 723 and 724 may be formed to electrically connect to the contacts 360 and 362, and conductive traces 610, 612, 614, 616, 618, and 619 may be formed over the conductive segments 230*b* and 240*b*. As such, the structure illustrated in FIG. 1C may be formed.

In some embodiments, further referring to FIGS. 1A-1D, one or more operations which are the same or similar to those illustrated in FIGS. 2A-9D may be performed to form the semiconductor device 1.

Figure 10A:
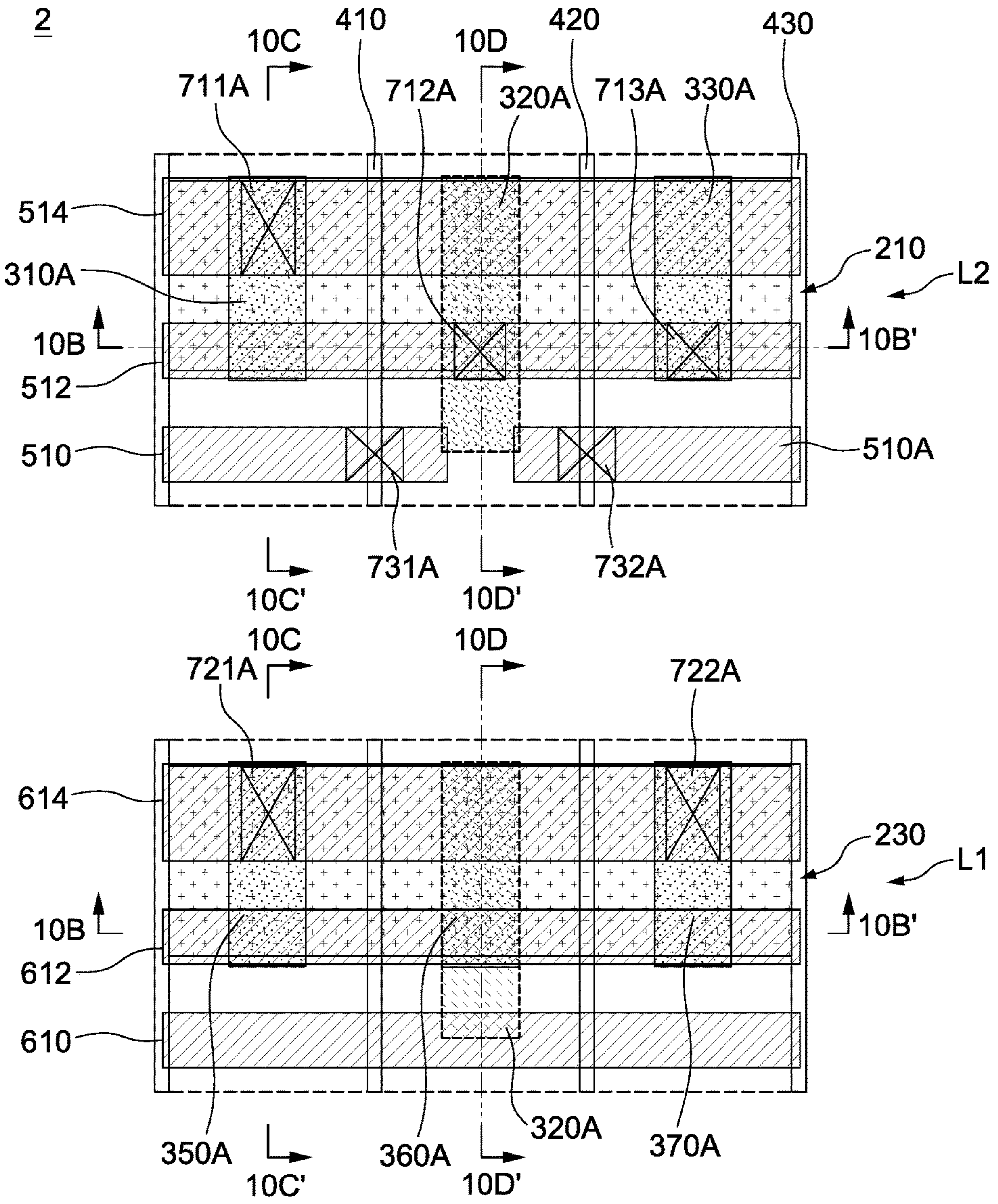
FIG. 10A is a top view of a semiconductor device in accordance with some embodiments of the present disclosure.
Figure 10B:
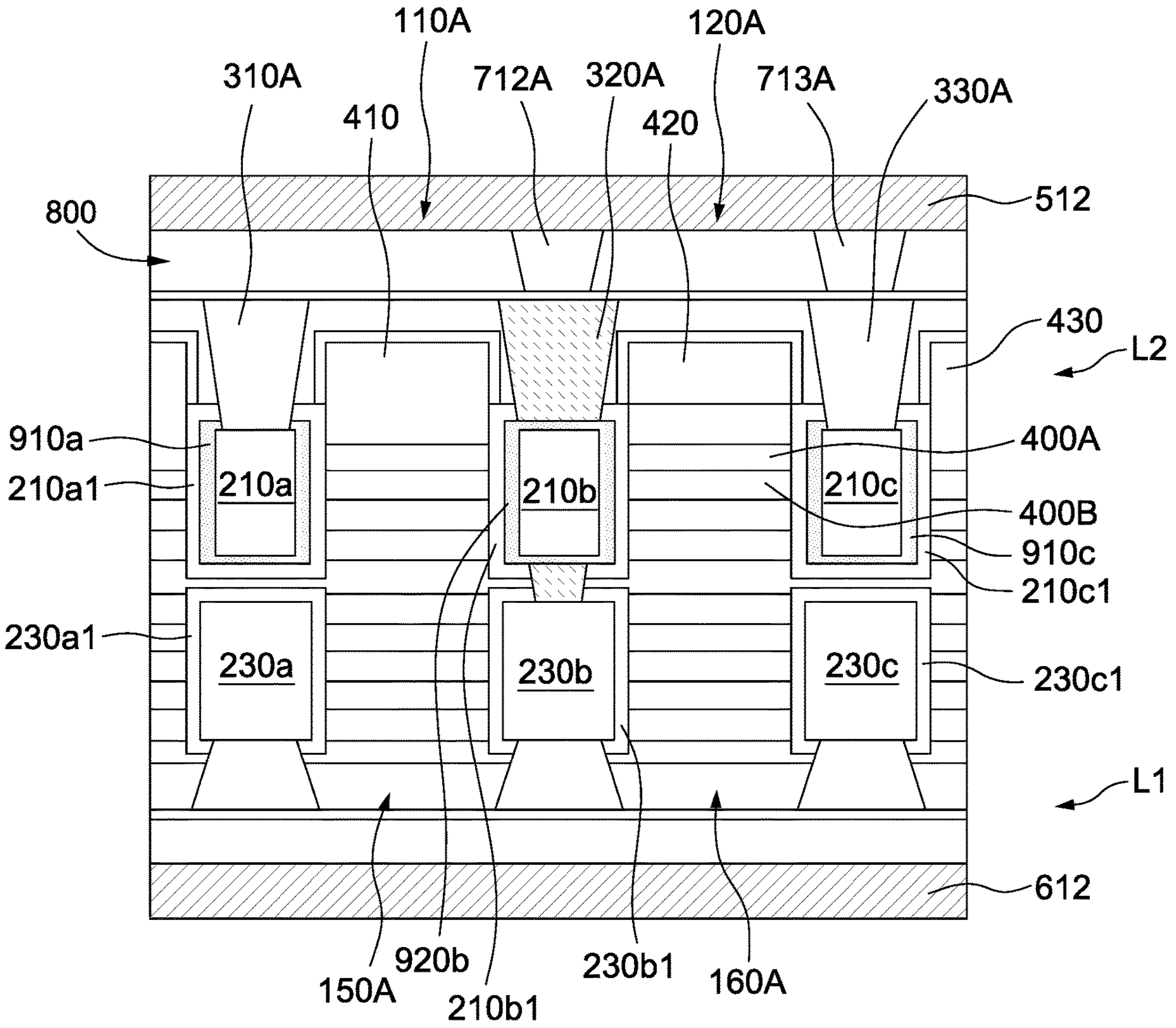
FIG. 10B is a cross-sectional view of a semiconductor device in accordance with some embodiments of the present disclosure.
Figure 10C:
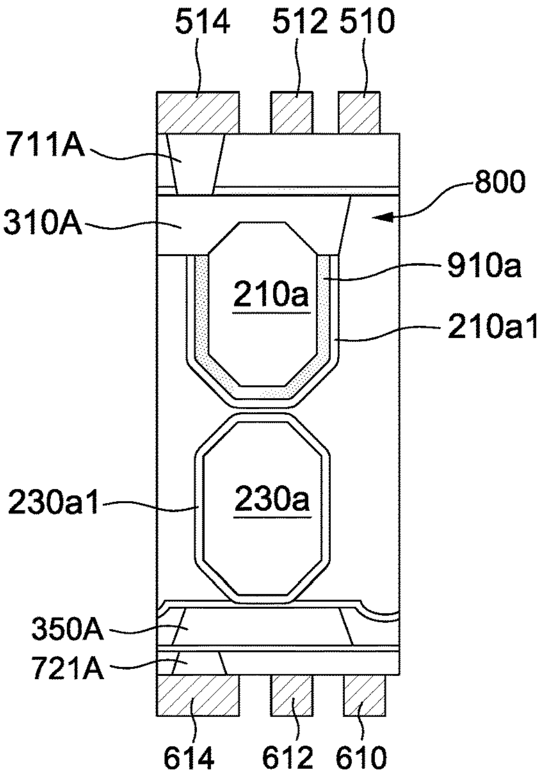
FIG. 10C is a cross-sectional view of a semiconductor device in accordance with some embodiments of the present disclosure.
Figure 10D:
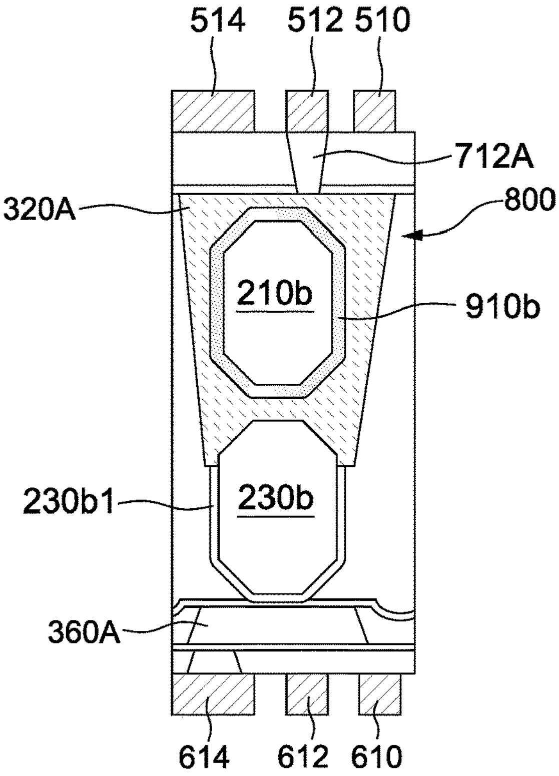
FIG. 10D is a cross-sectional view of a semiconductor device in accordance with some embodiments of the present disclosure.

FIG. 10A is a top view of a semiconductor device 2 in accordance with some embodiments of the present disclosure. FIG. 10B is a cross-sectional view of a semiconductor device 2 in accordance with some embodiments of the present disclosure. FIG. 10C is a cross-sectional view of a semiconductor device 2 in accordance with some embodiments of the present disclosure. FIG. 10D is a cross-sectional view of a semiconductor device 2 in accordance with some embodiments of the present disclosure. In some embodiments, FIG. 10B illustrates a cross-sectional view along the cross-sectional line 10B-10B' in FIG. 10A, FIG. 10C illustrates a cross-sectional view along the cross-sectional line 10C-10C' in FIG. 10A, and FIG. 10D illustrates a cross-sectional view along the cross-sectional line 10D-10D' in FIG. 10A. In some embodiments, FIG. 10A illustrates a top view of a lower layer L1 and a top view of an upper layer L2 of the semiconductor device 2. In some embodiments, the semiconductor device 2 is similar to the semiconductor device 1 in FIGS. 1A-1D, with differences therebetween as follows. Descriptions of similar components are omitted.

Referring to FIGS. 10A-10D, the semiconductor device 2 may be a portion of a standard cell. The semiconductor device 2 may include at least transistors 110A, 120A, 150A, and 160A. In some embodiments, the transistors 110A and 120A are stacked over the transistors 150A and 160A. The transistors 110A and 120A may have the same conductivity type, and the transistors 150A and 160A may have the same conductivity type. The transistors at the lower layer L1 and the transistors at the upper layer L2 may have opposite conductivity types. In some embodiments, the transistors 110A and 120A are n-type transistors, and the transistors 150A and 160A are p-type transistors, and vice versa.

Referring to FIGS. 10A-10D, the layout structure of the semiconductor device 2 may include active regions 210 and 230, contacts 310A, 320A, 330A, 350A, 360A, and 370A (also referred to as "source/drain (S/D) contacts"), gates 410, 420, and 430, and stacked channel structures each including nanosheet channels 400A and 400B. Each of the active regions may include conductive segments (e.g., epitaxial structures). The conductive segments of the active regions may serve as source/drains (S/Ds) of the transistors. In some embodiments, the transistor 110A includes the gate 410 and the conductive segments 210*a* and 210*b* on opposite sides of the gate 410. In some embodiments, the transistor 120A includes the gate 420 and the conductive segments 210*b* and 210*c* on opposite sides of the gate 420. In some embodiments, the transistor 150A includes the gate 410 and the conductive segments 230*a* and 230*b* on opposite sides of the gate 410. In some embodiments, the transistor 160A includes the gate 420 and the conductive segments 230*b* and 230*c* on opposite sides of the gate 420. In some embodiments, the gate 430 is a dummy gate. In some other embodiments, the gate 430 is a functional gate of a device adjacent to the cell of the semiconductor device 2. In some embodiments, each stack of the nanosheet channels 400A and 400B is between adjacent conductive segments at the upper layer L2 and between adjacent conductive segments the lower layer L1.

Referring to FIGS. 10A-10D, the layout structure of the semiconductor device 2 may further include conductive traces 510, 510A, 512, 514, 610, 612, and 614, conductive vias 711A, 712A, 713A, 721A, 722A, 731A, and 732A, and an insulation structure 800. In some embodiments, the conductive vias 711A, 712A, and 713A serve to electrically connect the S/D contacts (e.g., the contacts 310A, 320A, and 330A) at the upper layer L2 to the conductive traces over the upper layer L2. In some embodiments, the conductive vias 721A and 722A serve to electrically connect the S/D contacts (e.g., the contacts 350A, 360A, and 370A) at the lower layer L1 to the conductive traces under the lower layer L1. In some embodiments, the conductive vias 731A and 732A serve to electrically connect the gates to the conductive traces over the upper layer L2.

Referring to FIGS. 10A-10D, the layout structure of the semiconductor device 2 may further include at least isolation layers 910*a*, 910*b*, and 910*c*. In some embodiments, each of the isolation layers covers a corresponding conductive segment at the upper layer L2. For example, the isolation layer 910*a* may cover the conductive segment 210*a*, the isolation layer 910*b* may cover the conductive segment 210*b*, and the isolation layer 910*c* may cover the conductive segment 210*c*.

Referring to FIGS. 10A-10D, in some embodiments, the contact 320A covers and is electrically isolated from the conductive segment (or the S/D) 210*b* of the transistor 110A, and the contact 320A is electrically connected to the transistor 120A. In some embodiments, the contact 320A is electrically connected to the conductive segment (or the S/D) 210*c* of the transistor 120A through the conductive via 712A, the conductive trace 510A, and the conductive via 713A. In some embodiments, the isolation layer 920*b* covers a circumferential surface of the conductive segment 210*b* and electrically isolates the contact 320A from the conductive segment 210*b*. In some embodiments, the isolation layer 920*b* is between and directly contacts the contact 320A and the conductive segment (or the S/D) 210*b* of the transistor 110A. In some embodiments, the contact 320A covers or contacts a circumferential surface of the isolation layer 920*b*.

Referring to FIGS. 10A-10D, in some embodiments, the contact 320A is electrically connected to transistor 150A. In some embodiments, the contact 320A further covers the conductive segment (or the S/D) 230*b* of the transistor 150A. In some embodiments, the conductive segment 230*a* is directly under the conductive segment 210*a*, and the conductive segment 230*b* is directly under the conductive segment 210*b*. In some embodiments, the contact 320A is electrically connected to the conductive segment (or the S/D) 230*b* of the transistor 150A. In some embodiments, the transistor 150A is offset from the transistor 120 from a top view perspective, and the transistor 150A is electrically connected to the transistor 120 through the contact 320A. In some embodiments, the conductive segment (or the S/D) 230*b* of the transistor 150A is electrically connected to the conductive segment (or the S/D) 210*c* of the transistor 120 through the contact 320A, the conductive via 712A, the conductive trace 510A, and the conductive via 713A.

In some embodiments, the spacer layer 230*b*1 has an opening exposing a portion of the conductive segment 230*b* which contacts and electrically connects to the contact 320A. In some embodiments, the contact 320A directly contacts a portion of the conductive segment 230*b* of the transistor 150A. In some embodiments, the contact 320A include a portion conformally formed on the conductive segment 230*b* of the transistor 150A. In some embodiments, the contact 320A includes an extension between the transistor 110A and the transistor 150A.

In some embodiments, the conductive segment 210*b* is an internal common S/D or a shared S/D between different transistors. In some embodiments, the transistor 110A and the transistor 120A share the conductive segment 210*b* as a shared S/D. In some embodiments, the isolation layer 920*b* covers the conductive segment 210*b* (or the shared S/D), and the conductive segment 210*b* (or the shared S/D) is electrically isolated from an external connector. That is, there is not external connector electrically connected to the conductive segment 210*b*.

Figure 10E:
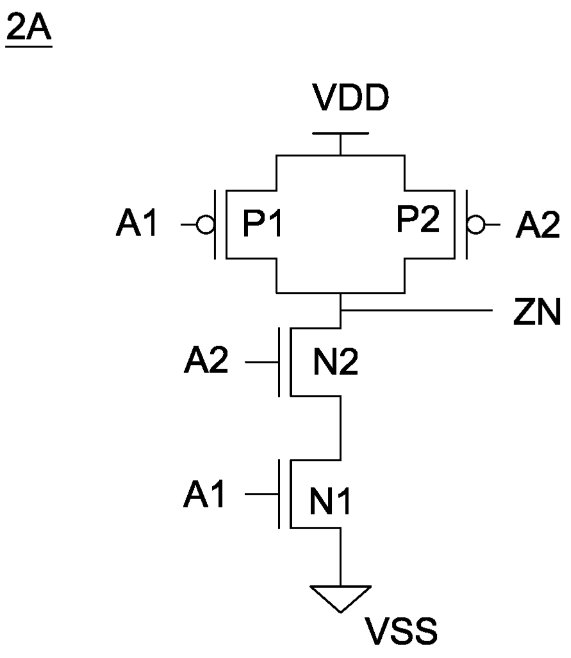
FIG. 10E illustrates a schematic view of a circuit in accordance with some embodiments of the present disclosure.

The structure in FIGS. 10A-10D may be applied to various integrated circuits/circuit cells to increasing routing flexibility. FIG. 10E illustrates a schematic view of a circuit 2A in accordance with some embodiments of the present disclosure. In some embodiments, the circuit 2A illustrated in FIG. 10E may be implemented with the semiconductor device 2 illustrated in FIGS. 10A-10D. In some embodiments, the circuit 2A is an ND2D1 (NAND 2-input) circuit and includes NMOS transistors N1 and N2 and PMOS transistors P1 and P2. The source terminal of the NMOS transistor N1 is coupled to a VSS signal, the gate terminal of the NMOS transistor N1 is coupled to an input signal A1, and the drain terminal of the NMOS transistor N1 is coupled the source terminal of the NMOS transistor N2. The gate terminal of the NMOS transistor N2 is coupled to an input signal A2, and the source terminal of the NMOS transistor N2 is couple to a signal Zn and the drain terminals of the PMOS transistors P1 and P2. The source terminals of the PMOS transistors P1 and P2 are coupled to a VDD signal, and the gate terminals of the PMOS transistors P1 and P2 are respectively coupled to the input terminal A1 and the input terminal A2.

Referring to FIGS. 10A-10E, the transistor N1 may correspond to the transistor 110A, the transistor N2 may correspond to the transistor 120A, and the transistor P1 and P2 may correspond to the transistors 150A and 160A. In some embodiments, the conductive trace 514 is electrically connected to the VSS signal and electrically connected to the contact 310A through the conductive via 711A. In some embodiments, the conductive trace 614 is electrically connected to the VDD signal and electrically connected to the contact 350A and the contact 370A through the conductive via 721A and the conductive via 722A, respectively. In some embodiments, the conductive trace 510 is electrically connected to the input signal A1, and the conductive trace 510A is electrically connected to the input signal A2. In some embodiments, the conductive segment 210*c* of the transistor 120A (i.e., the drain of the NMOS transistor 120A) is electrically connected to the conductive segment 230*c* of the transistor 150A and the transistor 160A (i.e., the common drain of the PMOS transistors 150A and 160A) through the conductive trace 512.

According to some embodiments of the present disclosure, with the aforesaid design, the contact 320A can extend over the conductive segment 210*b* to further electrically connect to conductive features in other transistors without arranging additional stacked conductive traces or vias. For example, the contact 320A can serve to electrically connect conductive features of two transistors that are across over one or more gates or at different elevations (e.g., at the upper layer L2 and the lower layer L1). Therefore, the routing flexibility can be increased, and the number of layers of conductive traces can be reduced.

In addition, according to some embodiments of the present disclosure, the contact 320A passes over without electrically connecting to the conductive segment 210*b* at the upper layer L2 and extends downwards to contact the conductive segment 230*b* stacked under the conductive segment 210*b*, and the contact 320A at the upper layer L2 can further electrically connect to other conductive features at the upper layer L2 through the conductive trace 510. Thus, vertical electrical connection between conductive features at different elevations or layers can be achieved without forming deep vias between conductive traces over the upper layer L2 and below the lower layer L1. Therefore, the risk of forming deep vias, e.g., reduced yields resulted from the relatively high aspect ratios of deep vias, relatively high resistance caused by the relatively long electrical paths provided by the deep vias, and etc., can be mitigated or prevented. Accordingly, the yields can be increased, and the structure stability and reliability of the semiconductor device 2 can be improved.

Moreover, according to some embodiments of the present disclosure, the contact 320A and other S/D contacts may be formed in the same operations, and/or the contact 320A may be disposed at the position preserved for S/D contacts. Furthermore, the vertical electrical connection mechanism can be realized by the contact 320A and existing conductive features, such as conductive traces (also referred to as "metal layer M0") and conductive vias between the S/D contacts and the conductive traces, no extra layers or volumes for additional conductive structures are required. Therefore, the device area or volume is not increased due to the formation of the vertical electrical connection mechanism (e.g., the contact 320A), which is advantageous to the reduction of device areas and sizes.

FIGS. 11A to 14C are schematic views of intermediate stages of a method of manufacturing a semiconductor device 2 in accordance with some embodiments of the present disclosure.

Figure 11A:
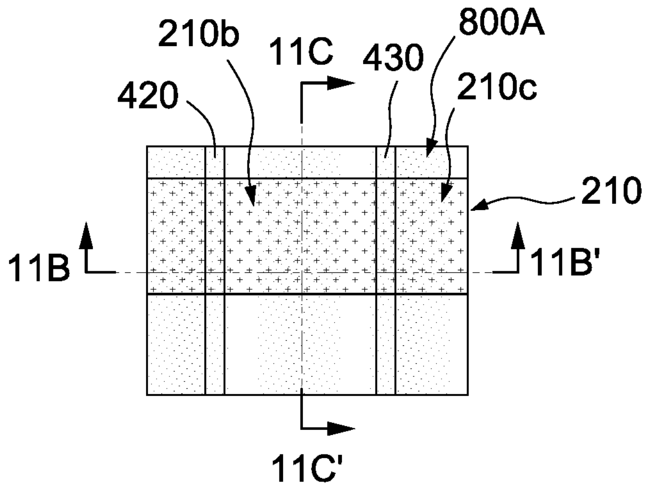
FIGS. 11A to 14C are schematic views of intermediate stages of a method of manufacturing a semiconductor device in accordance with some embodiments of the present disclosure.
Figure 11B:
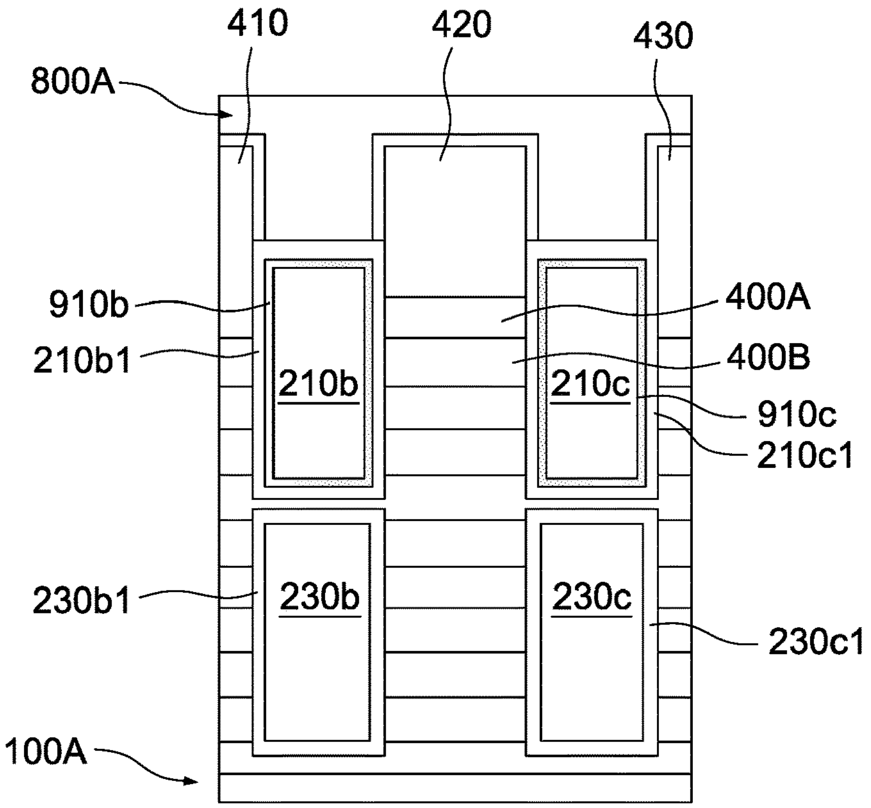
Figure 11C:
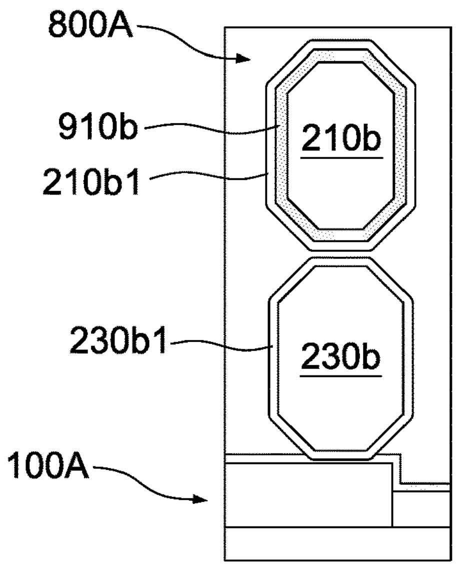

Referring to FIGS. 11A-11C, FIG. 11B illustrates a cross-sectional view along the cross-sectional line 11B-11B' in FIG. 11A, and FIG. 11C illustrates a cross-sectional view along the cross-sectional line 11C-11C' in FIG. 11A. In some embodiments, stacks of nanosheet channels 400A and 400B are formed over a substrate 100A, conductive segments 230*b* and 230*c* are formed on opposite sides of a stack of nanosheet channels 400A and 400B, and conductive segments 210*b* and 210*c* are formed over the conductive segments 230*b* and 230*c* and on opposite sides of the stack of nanosheet channels 400A and 400B. In some embodiments, gates 420 and 430 are formed on the stacks of nanosheet channels 400A and 400B, and an insulation structure 800A is formed covering the conductive segments 210*b*, 210*c*, 230*b*, and 230*c*, the nanosheet channels 400A and 400B, and the gates 420 and 430. In some embodiments, the insulation structure 800A includes an oxide layer, and the substrate 100A may include a silicon layer over a buried oxide layer.

Figure 12A:
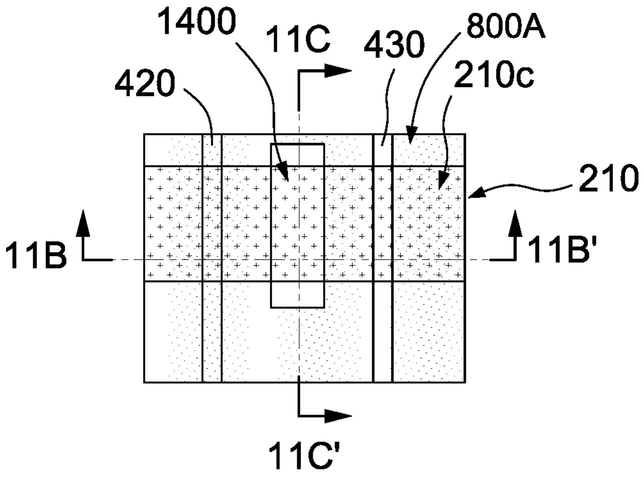
Figure 12B:
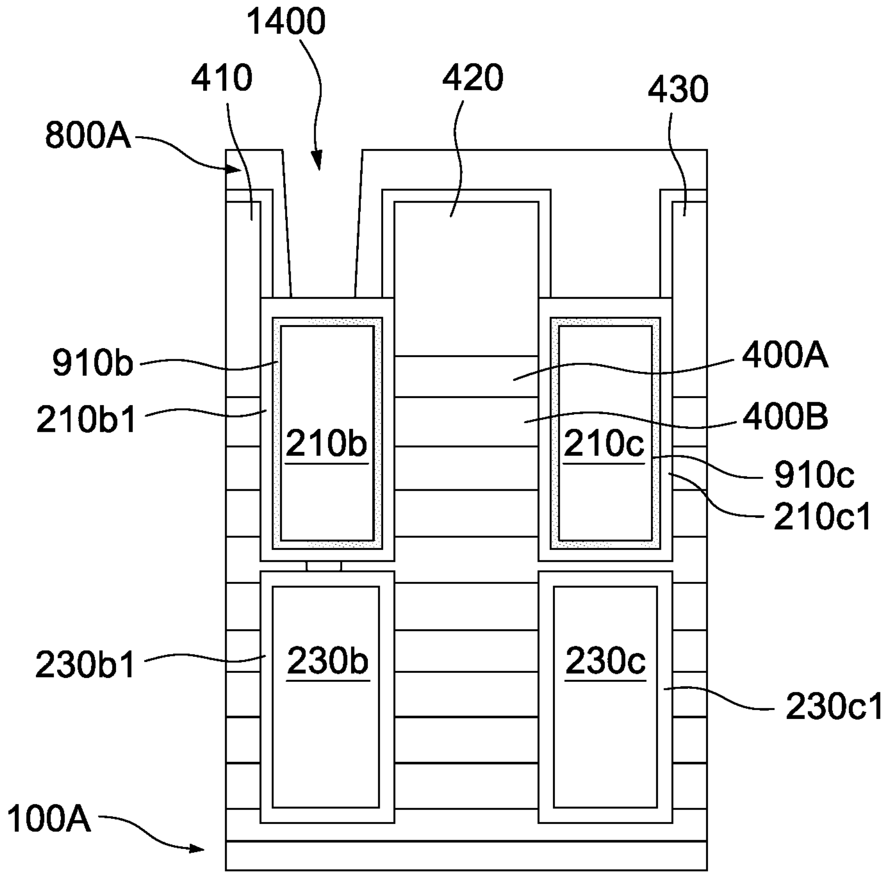
Figure 12C:
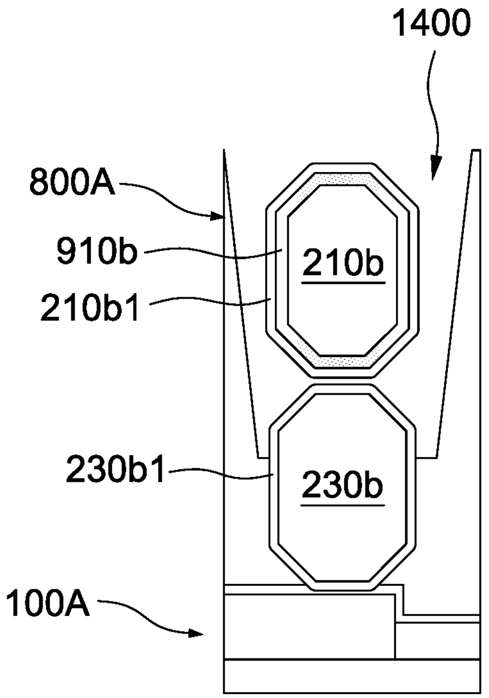

Referring to FIGS. 12A-12C, FIG. 12B illustrates a cross-sectional view along the cross-sectional line 11B-11B' in FIG. 12A, and FIG. 12C illustrates a cross-sectional view along the cross-sectional line 11C-11C' in FIG. 12A. In some embodiments, a trench 1400 may be formed in and passing through the insulation structure 800A. In some embodiments, the spacer layers 210*b*1 and 230*b*1 are exposed to the trench 1400. In some embodiments, the trench 1400 surrounds the conductive segment 210*b* and is spaced apart from the conductive segment 210*b* by the isolation layer 910*b* and the spacer layer 210*b*1. In some embodiments, a circumferential surface of the spacer layer 210*b*1 is exposed to the trench 1400. The trench 1400 may be formed by etching.

Figure 13A:
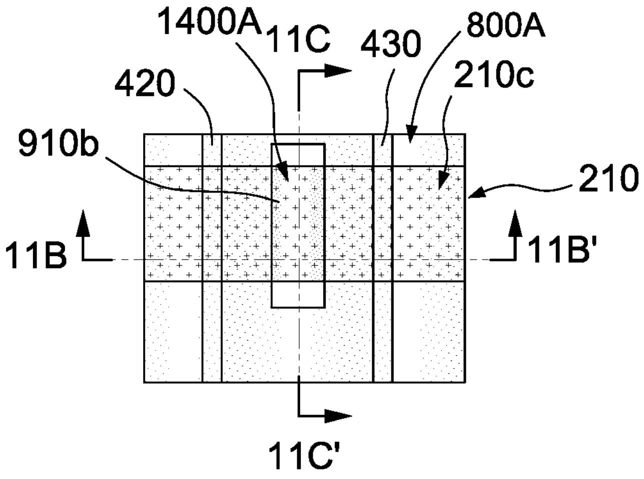
Figure 13B:
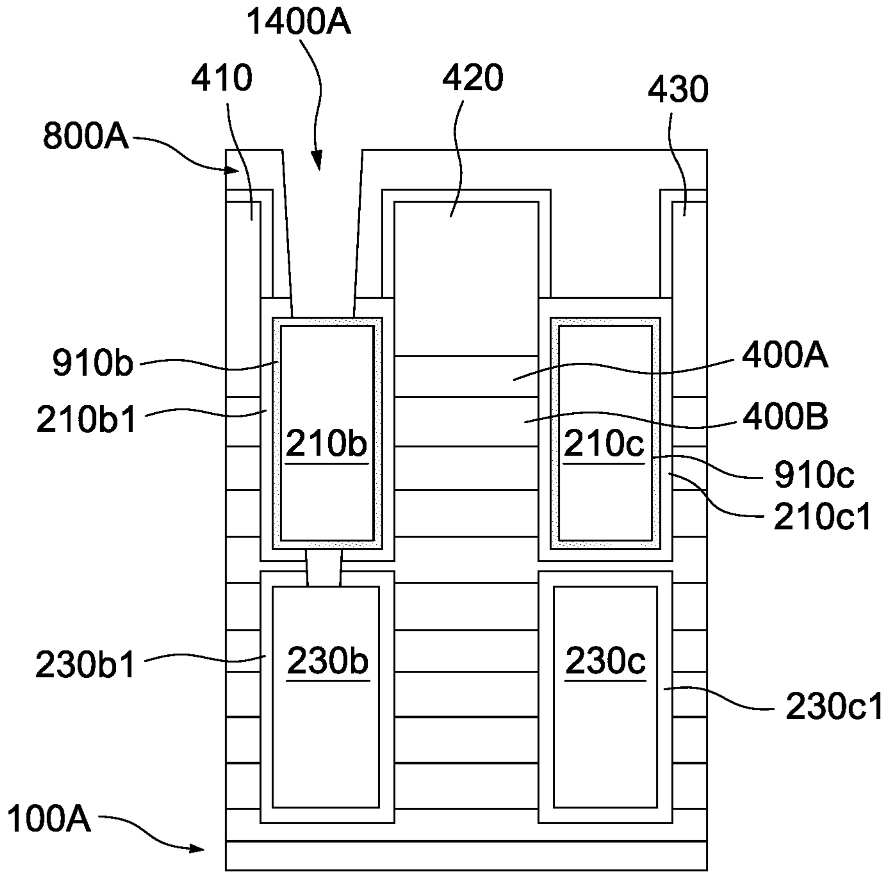
Figure 13C:
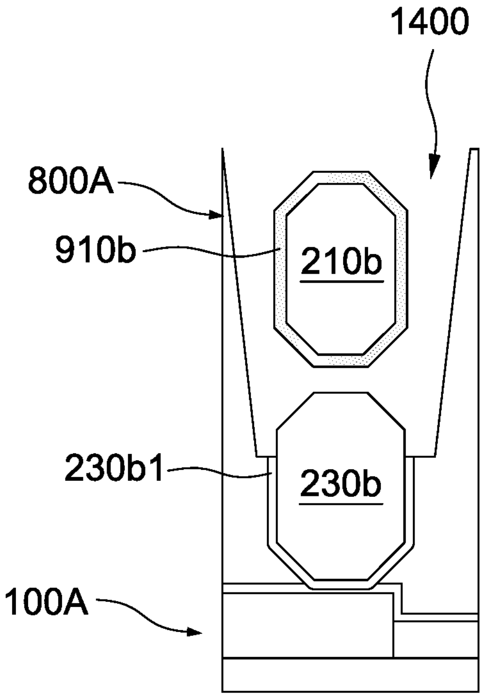

Referring to FIGS. 13A-13C, FIG. 13B illustrates a cross-sectional view along the cross-sectional line 11B-11B' in FIG. 13A, and FIG. 13C illustrates a cross-sectional view along the cross-sectional line 11C-11C' in FIG. 13A. In some embodiments, a portion of the spacer layer 210*b*1 and a portion of the spacer layer 230*b*1 exposed to the trench 1400 may be removed to form a trench 1400A. In some embodiments, a portion of the isolation layer 910*b* and a portion of the conductive layer of the conductive segment 230*b* are exposed to the trench 1400A. In some embodiments, the trench 1400A surrounds the conductive segment 210*b* and is spaced apart from the conductive segment 210*b* by the isolation layer 910*b*. In some embodiments, a circumferential surface of the isolation layer 910*b* is exposed to the trench 1400A. The removal operation may be formed by etching.

Figure 14A:
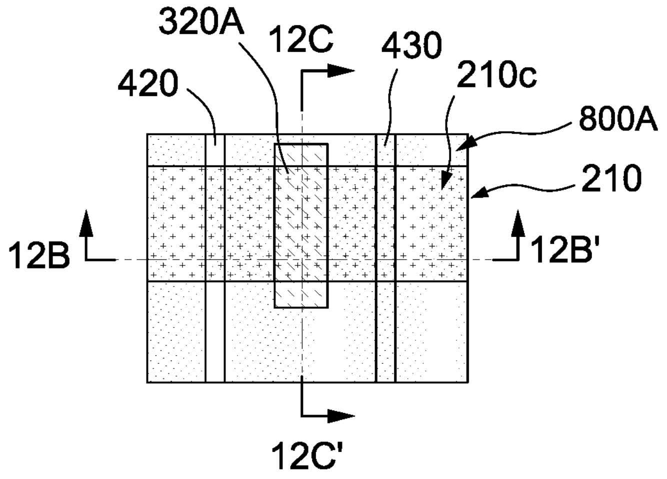
Figure 14B:
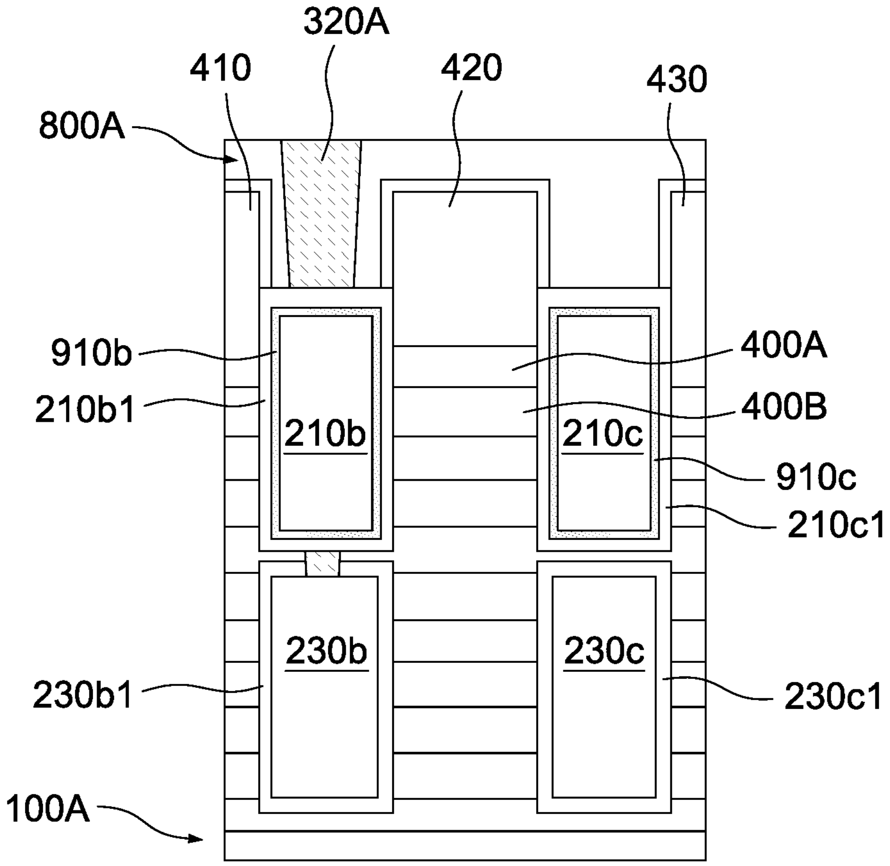
Figure 14C:
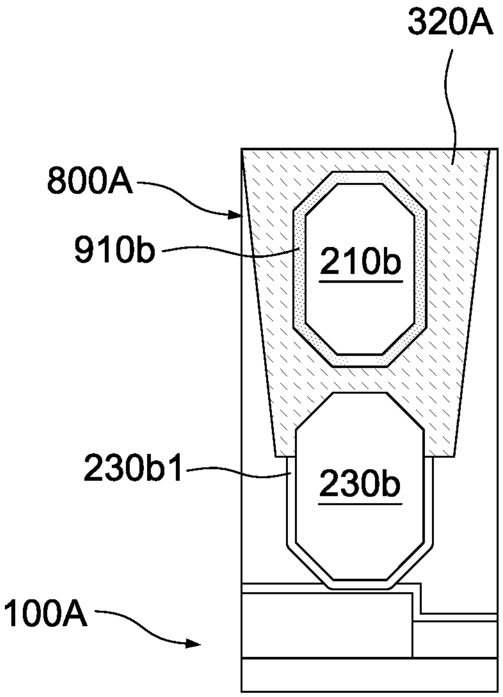

Referring to FIGS. 14A-14C, FIG. 14B illustrates a cross-sectional view along the cross-sectional line 11B-11B' in FIG. 14A, and FIG. 14C illustrates a cross-sectional view along the cross-sectional line 11C-11C' in FIG. 14A. In some embodiments, a conductive material is formed in the trench 1400A to form a contact 320A contacting the isolation layer 910*b* and a portion of the conductive segment 230*b*. The conductive material may be formed by deposition. As such, a semiconductor device 2B is formed.

In some embodiments, further referring to FIGS. 10A-10D, one or more operations which are the same or similar to those illustrated in FIGS. 11A-14C may be performed to form the semiconductor device 2.

Figure 15A:
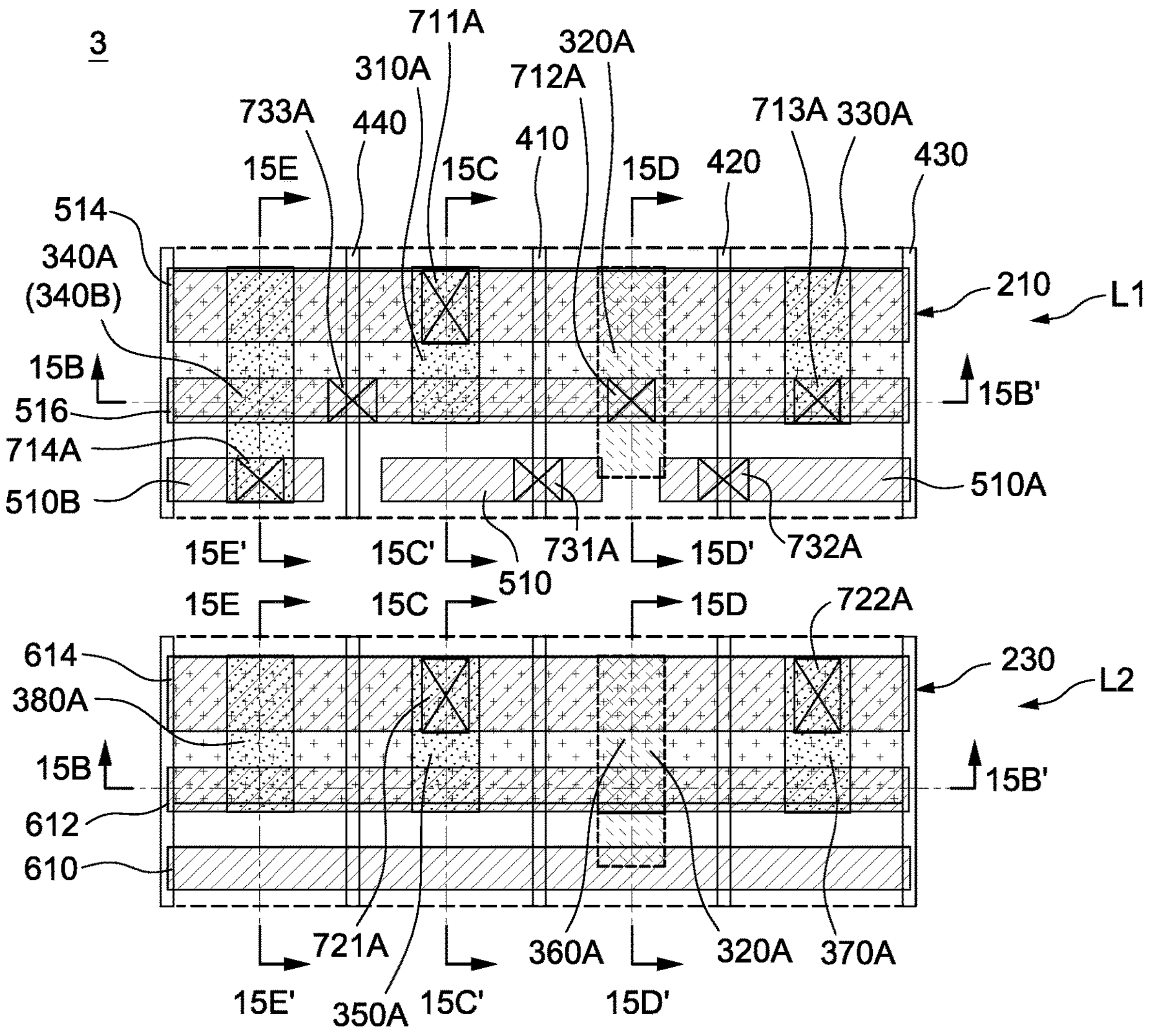
FIG. 15A is a top view of a semiconductor device in accordance with some embodiments of the present disclosure.
Figure 15B:
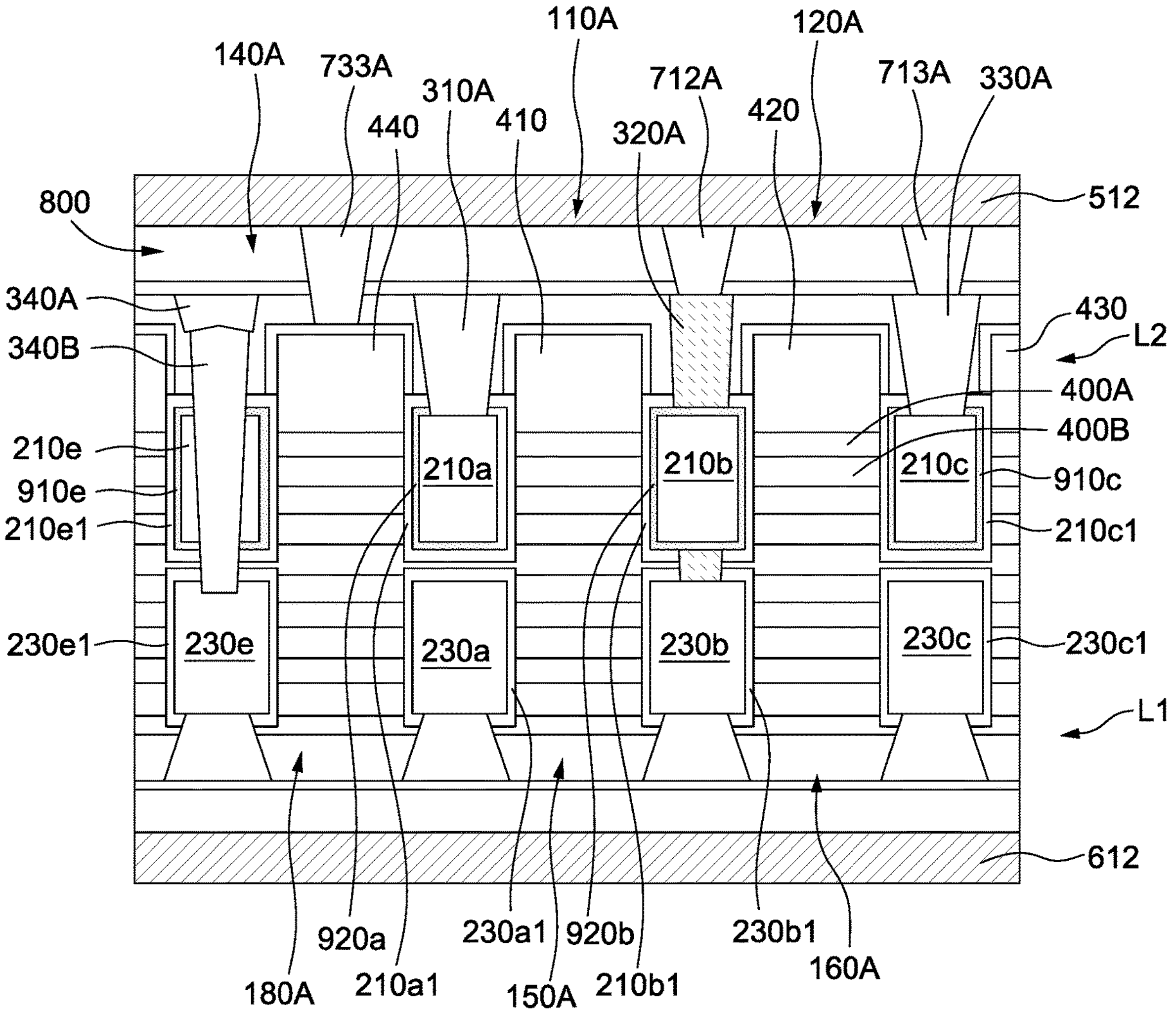
FIG. 15B is a cross-sectional view of a semiconductor device in accordance with some embodiments of the present disclosure.
Figure 15C:
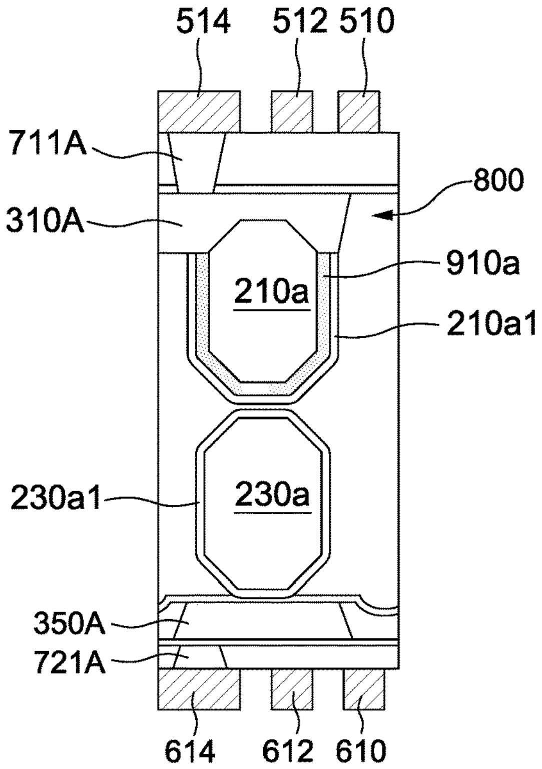
FIG. 15C is a cross-sectional view of a semiconductor device in accordance with some embodiments of the present disclosure.
Figure 15D:
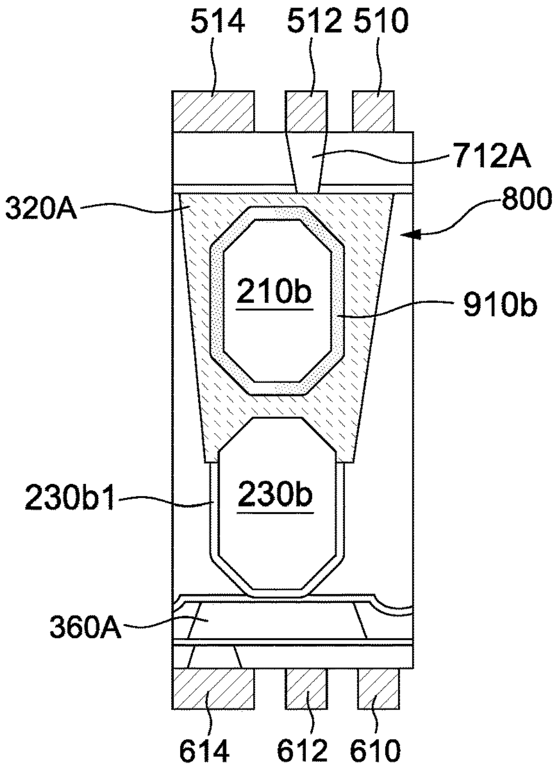
FIG. 15D is a cross-sectional view of a semiconductor device in accordance with some embodiments of the present disclosure.
Figure 15E:
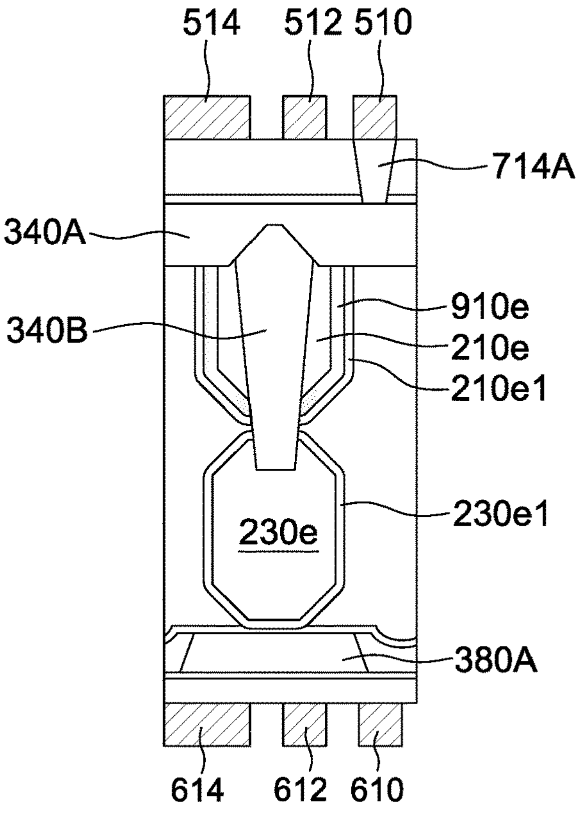
FIG. 15E is a cross-sectional view of a semiconductor device in accordance with some embodiments of the present disclosure.

FIG. 15A is a top view of a semiconductor device 3 in accordance with some embodiments of the present disclosure. FIG. 15B is a cross-sectional view of a semiconductor device 3 in accordance with some embodiments of the present disclosure. FIG. 15C is a cross-sectional view of a semiconductor device 3 in accordance with some embodiments of the present disclosure. FIG. 15D is a cross-sectional view of a semiconductor device 3 in accordance with some embodiments of the present disclosure. FIG. 15E is a cross-sectional view of a semiconductor device 3 in accordance with some embodiments of the present disclosure. In some embodiments, FIG. 15B illustrates a cross-sectional view along the cross-sectional line 15B-15B' in FIG. 15A, FIG. 15C illustrates a cross-sectional view along the cross-sectional line 15C-15C' in FIG. 15A, FIG. 15D illustrates a cross-sectional view along the cross-sectional line 15D-15D' in FIG. 15A, and FIG. 15E illustrates a cross-sectional view along the cross-sectional line 15E-15E' in FIG. 15A. In some embodiments, FIG. 15A illustrates a top view of a lower layer L1 and a top view of an upper layer L2 of the semiconductor device 3. In some embodiments, the semiconductor device 3 is similar to the semiconductor device 2 in FIGS. 10A-10D, with differences therebetween as follows. Descriptions of similar components are omitted.

Referring to FIGS. 15A-15E, the semiconductor device 3 may be a portion of a standard cell. The semiconductor device 3 may include at least transistors 110A, 120A, 140A, 150A, 160A, and 180A. The transistors 110A, 120A, and 140A may have the same conductivity type, and the transistors 150A, 160A, and 180A may have the same conductivity type. In some embodiments, the transistors 110A, 120A, and 140A are n-type transistors, and the transistors 150A, 160A, and 180A are p-type transistors, and vice versa.

Referring to FIGS. 15A-15E, the layout structure of the semiconductor device 3 may include active regions 210 and 230, contacts 310A, 320A, 330A, 340A, 340B, 350A, 360A, 370A, and 380A (also referred to as "source/drain (S/D) contacts"), gates 410, 420, 430, and 440, and stacked channel structures each including nanosheet channels 400A and 400B. Each of the active regions may include conductive segments (e.g., epitaxial structures). The conductive segments of the active regions may serve as source/drains (S/Ds) of the transistors. In some embodiments, the transistor 140A includes the gate 440 and the conductive segments 210*a* and 210*e* on opposite sides of the gate 440. In some embodiments, the transistor 180A includes the gate 440 and the conductive segments 230*a* and 230*e* on opposite sides of the gate 440.

Referring to FIGS. 15A-15E, the layout structure of the semiconductor device 3 may further include a conductive trace 510B, conductive vias 714A and 733A, and an isolation layer 910*e*. In some embodiments, the gate 440 is electrically connected to the trace 510 through the conductive via 733A. In some embodiments, the contact 340A is electrically connected to the conductive trace 510B through the conductive via 714A. In some embodiments, the contact 340B penetrates and electrically connects the conductive segment 210*e* and the conductive segment 230*e*. In some embodiments, the contact 340B penetrates the isolation layer 910*e* and the spacer layers 210*e*1 and 230*e*1 to electrically connect the conductive segment 230*e*, the conductive segment 210*e*, and the contact 340A.

Figure 15F:
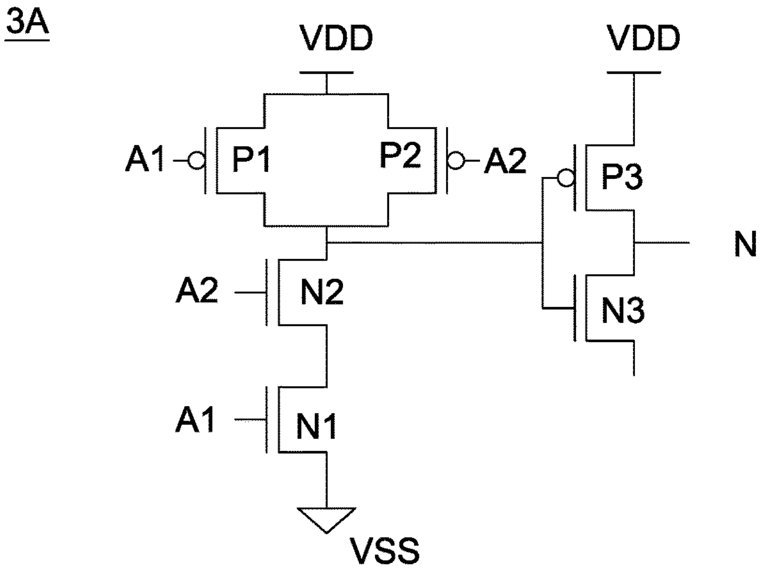
FIG. 15F illustrates a schematic view of a circuit in accordance with some embodiments of the present disclosure.

The structure in FIGS. 15A-15E may be applied to various integrated circuits/circuit cells to increasing routing flexibility. FIG. 15F illustrates a schematic view of a circuit 3A in accordance with some embodiments of the present disclosure. In some embodiments, the circuit 3A illustrated in FIG. 15F may be implemented with the semiconductor device 3 illustrated in FIGS. 15A-15E. In some embodiments, the circuit 3A is an AN2D1 circuit and includes NMOS transistors N1, N2, and N3 and PMOS transistors P1, P2, and P3. The gate terminal of the transistor N1 is coupled to the gate terminal of the transistor P1 and an input signal A1, the source terminal of the transistor N1 is coupled to the drain terminals of the transistors P1 and P2 and the gate terminals of the transistors N3 and P3, and the drain terminal of the transistor N1 is coupled to the source terminal of the transistor N2. The gate terminal of the transistor N2 is coupled to the gate terminal of the transistor P2 and an input signal A2, and the drain terminal of the transistor N2 is coupled to the drain terminal of the transistor N3 and a VSS signal. The source terminal of the transistor N3 is coupled to the drain terminals of the transistor P3 and a signal Z. The source terminal of the transistor P1 is coupled to a VDD signal. The source terminal of the transistor P2 is coupled to the source terminal of the transistor P3 and the VDD signal.

Referring to FIGS. 15A-15F, the transistor N1 may correspond to the transistor 110A, the transistor N2 may correspond to the transistor 120A, the transistor N3 may correspond to the transistor 140A, the transistor P1 and P2 may correspond to the transistors 150A and 160A, and the transistor P3 may correspond to the transistor 180A. In some embodiments, the gate 440 (i.e., the gate terminals of the transistors 140A and 180A) is connected to the conductive segment 210*c* of the transistor 120A (i.e., the drain of the NMOS transistor 120A) and the conductive segment 230*c* of the transistor 150A and the transistor 160A (i.e., the common drain of the PMOS transistors 150A and 160A) through the conductive trace 512.

Figure 16A:
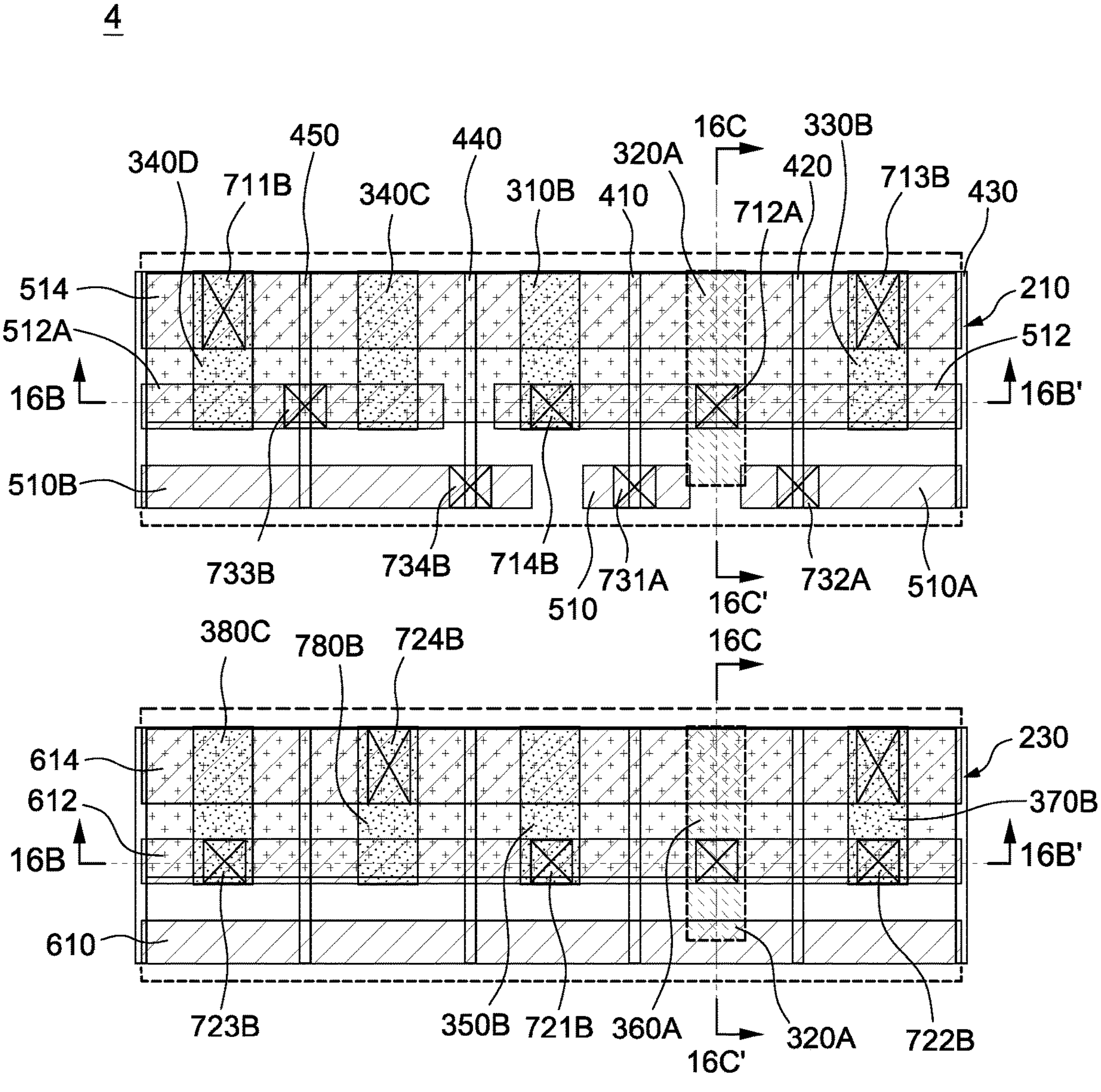
FIG. 16A is a top view of a semiconductor device in accordance with some embodiments of the present disclosure.
Figure 16B:
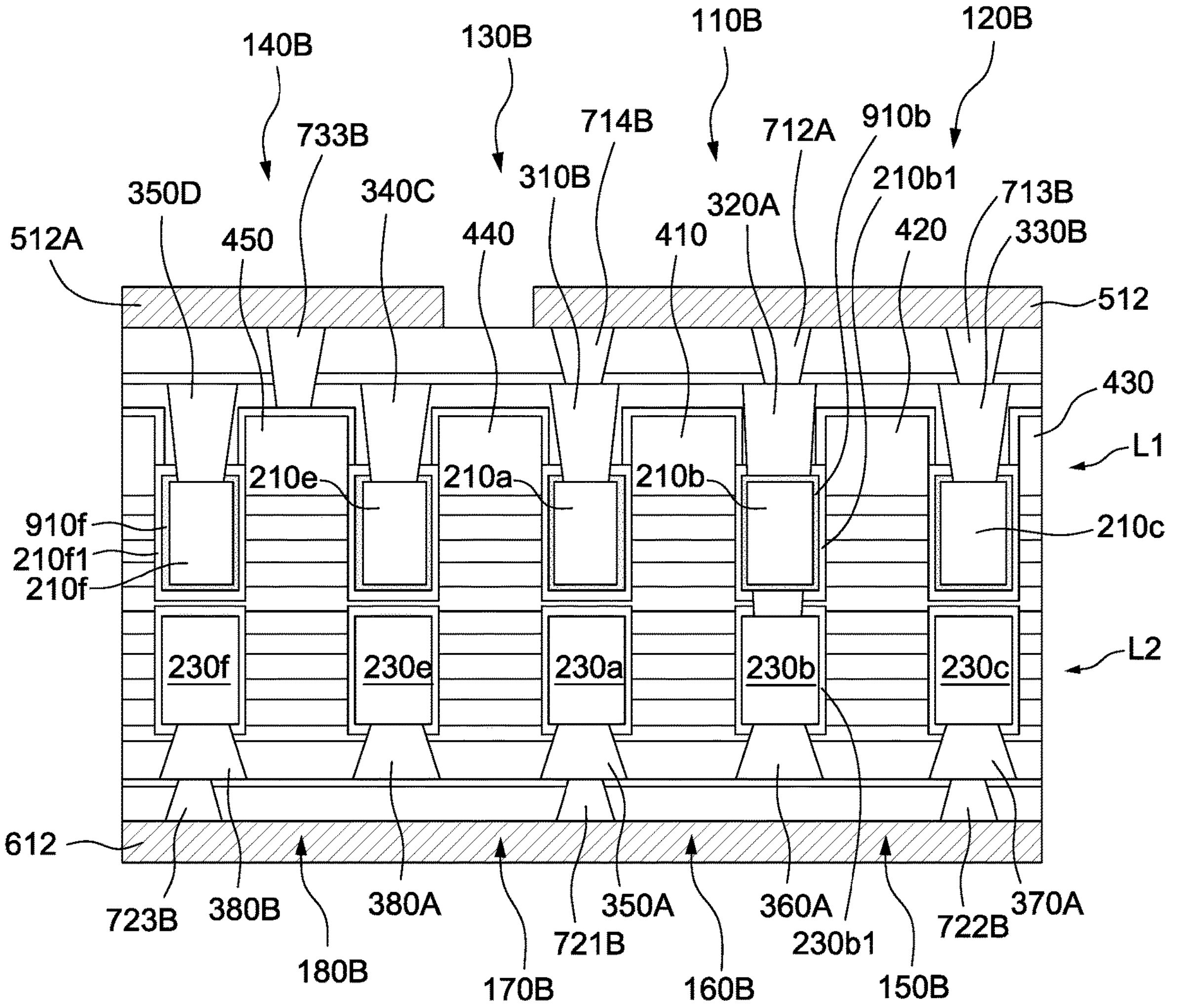
FIG. 16B is a cross-sectional view of a semiconductor device in accordance with some embodiments of the present disclosure.
Figure 16C:
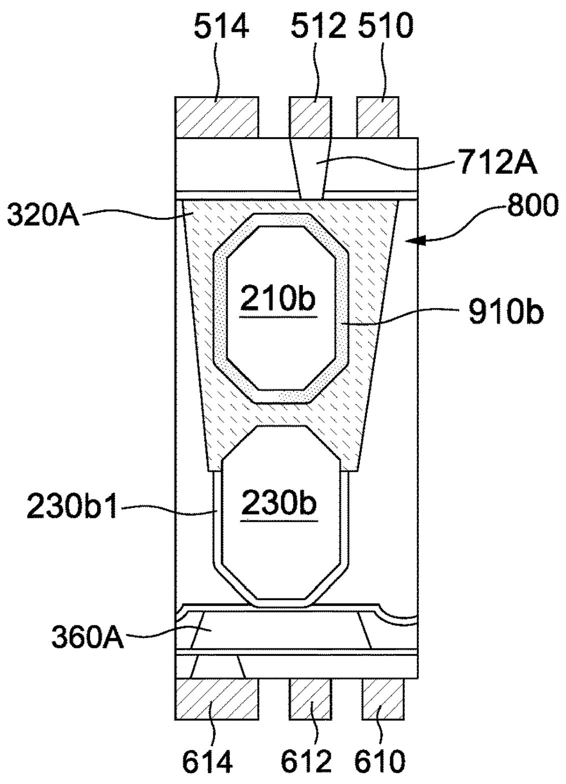
FIG. 16C is a cross-sectional view of a semiconductor device in accordance with some embodiments of the present disclosure.

FIG. 16A is a top view of a semiconductor device 4 in accordance with some embodiments of the present disclosure. FIG. 16B is a cross-sectional view of a semiconductor device 4 in accordance with some embodiments of the present disclosure. FIG. 16C is a cross-sectional view of a semiconductor device 4 in accordance with some embodiments of the present disclosure. In some embodiments, FIG. 16B illustrates a cross-sectional view along the cross-sectional line 16B-16B' in FIG. 16A, and FIG. 16C illustrates a cross-sectional view along the cross-sectional line 16C-16C' in FIG. 16A. In some embodiments, FIG. 16A illustrates a top view of a lower layer L1 and a top view of an upper layer L2 of the semiconductor device 4. In some embodiments, the semiconductor device 4 is similar to the semiconductor device 2 in FIGS. 10A-10D, with differences therebetween as follows. Descriptions of similar components are omitted.

Referring to FIGS. 16A-16C, the semiconductor device 4 may be a portion of a standard cell. The semiconductor device 2 may include at least transistors 110B, 120B, 130B, 140B, 150B, 160B, 170B, and 180B. In some embodiments, the transistors 110B, 120B, 130B, and 140B are stacked over the transistors 150B, 160B, 170B, and 180B. The transistors 110B, 120B, 130B, and 140B may have the same conductivity type, and the transistors 150B, 160B, 170B, and 180B may have the same conductivity type. The transistors at the lower layer L1 and the transistors at the upper layer L2 may have opposite conductivity types. In some embodiments, the transistors 110B, 120B, 130B, and 140B are n-type transistors, and the transistors 150B, 160B, 170B, and 180B are p-type transistors, and vice versa.

Referring to FIGS. 16A-16C, the layout structure of the semiconductor device 2 may include active regions 210 and 230, contacts 310B, 320A, 330B, 340C, 340D, 350B, 360B, 370B, and 380B (also referred to as "source/drain (S/D) contacts"), gates 410, 420, 430, 440, and 450, and stacked channel structures each including nanosheet channels 400A and 400B. Each of the active regions may include conductive segments (e.g., epitaxial structures). The conductive segments of the active regions may serve as source/drains (S/Ds) of the transistors. In some embodiments, the transistor 110B includes the gate 410 and the conductive segments 210*a* and 210*b* on opposite sides of the gate 410. In some embodiments, the transistor 120B includes the gate 420 and the conductive segments 210*b* and 210*c* on opposite sides of the gate 420. In some embodiments, the transistor 130B includes the gate 440 and the conductive segments 210*a* and 210*e* on opposite sides of the gate 440. In some embodiments, the transistor 140B includes the gate 450 and the conductive segments 210*e* and 210*f* on opposite sides of the gate 450. In some embodiments, the transistor 150B includes the gate 410 and the conductive segments 230*a* and 230*b* on opposite sides of the gate 410. In some embodiments, the transistor 160B includes the gate 420 and the conductive segments 230*b* and 230*c* on opposite sides of the gate 420. In some embodiments, the transistor 170B includes the gate 440 and the conductive segments 230*a* and 230*e* on opposite sides of the gate 440. In some embodiments, the transistor 180B includes the gate 450 and the conductive segments 230*e* and 230*f* on opposite sides of the gate 450. In some embodiments, each stack of the nanosheet channels 400A and 400B is between adjacent conductive segments at the upper layer L2 and between adjacent conductive segments the lower layer L1.

Referring to FIGS. 16A-16C, the layout structure of the semiconductor device 4 may further include conductive traces 510, 510A, 510B, 512, 512A, 514, 610, 612, and 614, conductive vias 711B, 712A, 713B, 714B, 721B, 722B, 723B, 724B, 731A, 732A, 733B, and 734B, and an insulation structure 800. In some embodiments, the conductive vias 711B, 712A, 713B, and 714B serve to electrically connect the S/D contacts (e.g., the contacts 310B, 320A, 330B, 340C, and 340D) at the upper layer L2 to the conductive traces over the upper layer L2. In some embodiments, the conductive vias 721B, 722B, 723B, and 724B serve to electrically connect the S/D contacts (e.g., the contacts 350B, 360B, 370B, and 380B) at the lower layer L1 to the conductive traces under the lower layer L1. In some embodiments, the conductive vias 731A, 732A, 733B, and 734B serve to electrically connect the gates to the conductive traces over the upper layer L2.

Referring to FIGS. 16A-16C, the layout structure of the semiconductor device 4 may further include at least isolation layers 910*a*, 910*b*, 910*c*, 910*e*, and 910*f*. In some embodiments, each of the isolation layers covers a corresponding conductive segment at the upper layer L2. For example, the isolation layer 910*a* may cover the conductive segment 210*a*, the isolation layer 910*b* may cover the conductive segment 210*b*, the isolation layer 910*c* may cover the conductive segment 210*c*, the isolation layer 910*e* may cover the conductive segment 210*e*, and the isolation layer 910*f* may cover the conductive segment 210*f*.

Referring to FIGS. 16A-16C, in some embodiments, the contact 320A covers and is electrically isolated from the conductive segment (or the S/D) 210*b* of the transistor 110B, and the contact 320A is electrically connected to the conductive segment 230*b*. In some embodiments, the contact 320A is electrically connected to the transistors 110B, 130B, 150B, and 160B. In some embodiments, the contact 320A is electrically connected to the conductive segment 210*a* (or the S/D) of the transistors 110B and 130B. In some embodiments, the contact 320A is electrically connected to the conductive segment 210*a* through the contact 310B, the conductive via 714B, the conductive trace 512, and the conductive via 712A. In some embodiments, the contact 320A electrically connects the transistors 110B and 130B to the transistors 150B and 160B. In some embodiments, the isolation layer 920*b* covers a circumferential surface of the conductive segment 210*b* and electrically isolates the contact 320A from the conductive segment 210*b*. In some embodiments, the isolation layer 920*b* is between and directly contacts the contact 320A and the conductive segment (or the S/D) 210*b* of the transistor 110B. In some embodiments, the contact 320A covers or contacts a circumferential surface of the isolation layer 920*b*.

In some embodiments, the conductive segment 210*b* is an internal common S/D or a shared S/D between different transistors. In some embodiments, the transistor 110B and the transistor 120B share the conductive segment 210*b* as a shared S/D. In some embodiments, the isolation layer 920*b* covers the conductive segment 210*b* (or the shared S/D), and the conductive segment 210*b* (or the shared S/D) is electrically isolated from an external connector. That is, there is not external connector electrically connected to the conductive segment 210*b*.

Figure 16D:
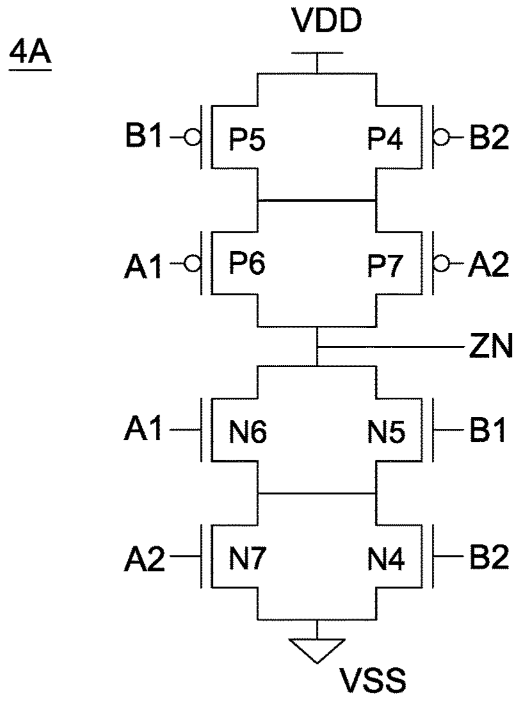
FIG. 16D illustrates a schematic view of a circuit in accordance with some embodiments of the present disclosure.

The structure in FIGS. 16A-16C may be applied to various integrated circuits/circuit cells to increasing routing flexibility. FIG. 16D illustrates a schematic view of a circuit 4A in accordance with some embodiments of the present disclosure. In some embodiments, the circuit 4A illustrated in FIG. 16D may be implemented with the semiconductor device 4 illustrated in FIGS. 16A-16C. In some embodiments, the circuit 4A is an AOI22D1 circuit and includes NMOS transistors N4, N5, N6, and N7 and PMOS transistors P4, P5, P6, and P7. The gate terminal of the transistor N4 is coupled to the gate terminal of the transistor P4 and an input signal B2, the source terminal of the transistor N4 is coupled to the drain terminals of the transistor N5, and the drain terminal of the transistor N4 is coupled to a VSS signal. The gate terminal of the transistor N5 is coupled to the gate terminal of the transistor P5 and an input signal B1, and the source terminal of the transistor N5 is coupled to the drain terminals of the transistors P6 and P7, the source terminal of the transistor N6, and a ZN signal. The gate terminal of the transistor N6 is coupled to the gate terminal of the transistor P6 and an input signal A1, and the drain terminal of the transistor N6 is coupled to the source terminal of the transistor N7. The gate terminal of the transistor N7 is coupled to the gate terminal of the transistor P7 and an input signal A2, and the drain terminal of the transistor N7 is coupled to the VSS signal. The source terminal of the transistor P4 is coupled to a VDD signal and the source terminal of the transistor P5, and the drain terminal of the transistor P4 is coupled to the drain terminal of the transistor P5 and the source terminals of the transistors P6 and P7.

Referring to FIGS. 16A-16D, the transistor N4 may correspond to the transistor 120B, the transistor N5 may correspond to the transistor 110B, the transistor N6 may correspond to the transistor 130B, the transistor N7 may correspond to the transistor 140B, the transistor P4 and P5 may correspond to the transistors 170B and 180B, and the transistor P6 and P7 may correspond to the transistors 150B and 160B. In some embodiments, the conductive trace 514 is electrically connected to the VSS signal and electrically connected to the contact 340D and the contact 330B through the conductive via 711B and the conductive via 731B, respectively. In some embodiments, the conductive trace 614 is electrically connected to the VDD signal and electrically connected to the contact 380B through the conductive via 724B. In some embodiments, the conductive trace 510 is electrically connected to the input signal A1, and the conductive trace 510A is electrically connected to the input signal A2. In some embodiments, the conductive segment 230*b* (the shared drain of the transistors 150B and 160B) is electrically connected to the conductive segment 210*a* (the shared drain of the transistors 110B and 130B) through the contact 320A, the conductive via 712A, the conductive trace 512, the conductive via 714B, and the contact 310B.

Figure 17A:
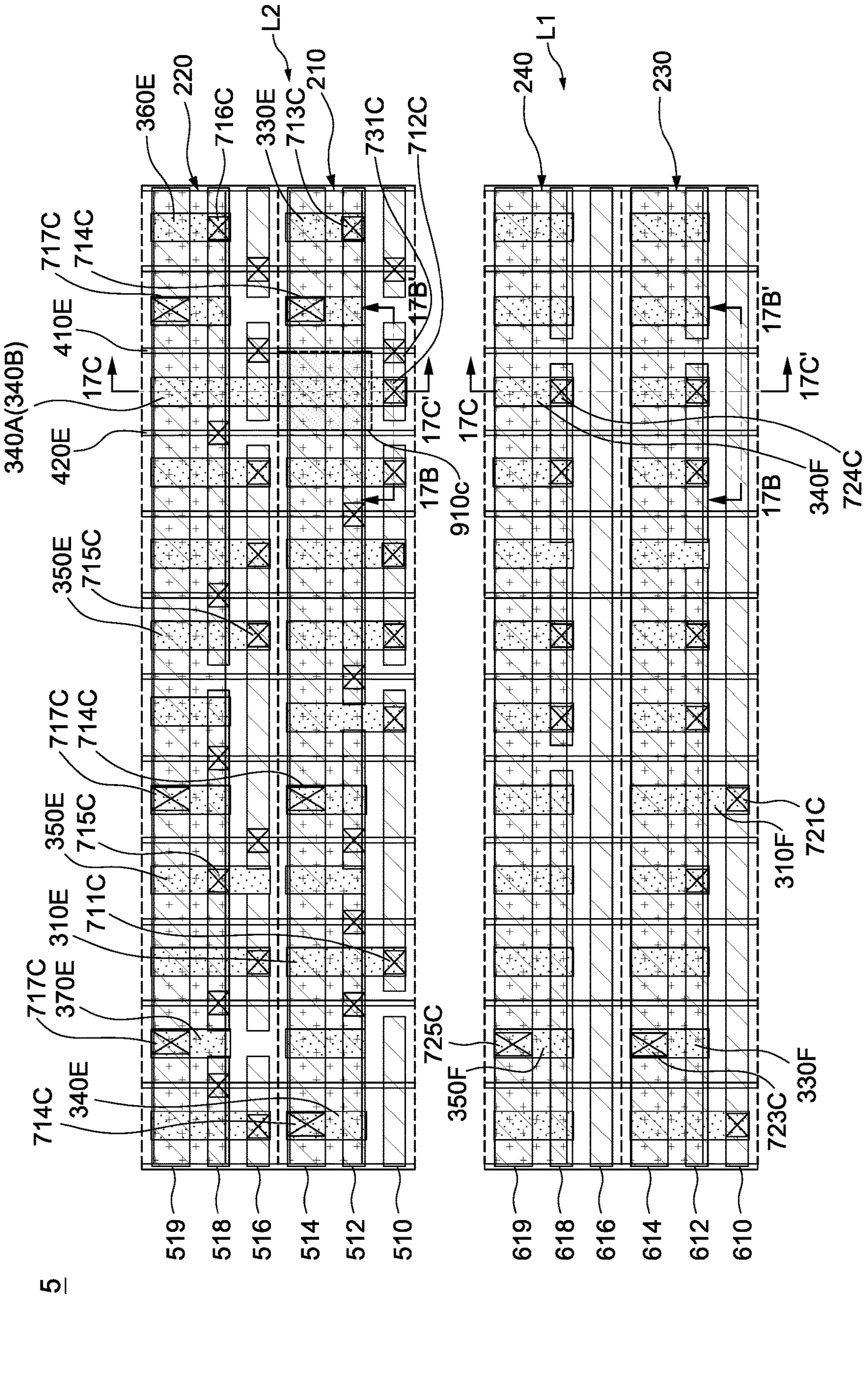
FIG. 17A is a top view of a semiconductor device in accordance with some embodiments of the present disclosure.
Figure 17B:
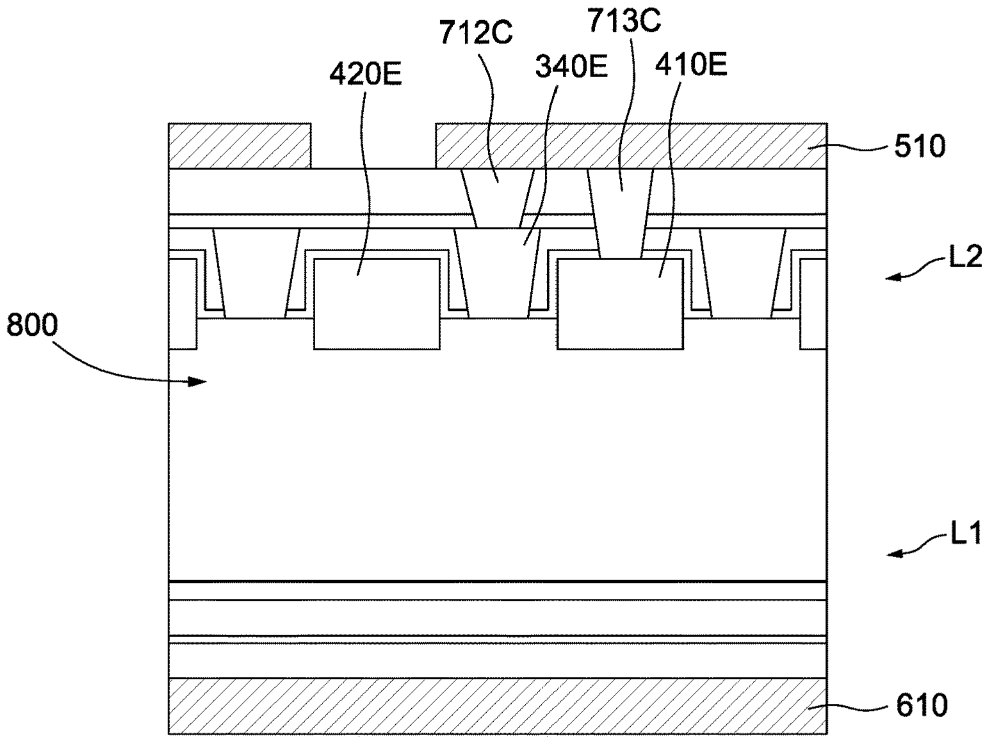
FIG. 17B is a cross-sectional view of a portion of a semiconductor device in accordance with some embodiments of the present disclosure.
Figure 17C:
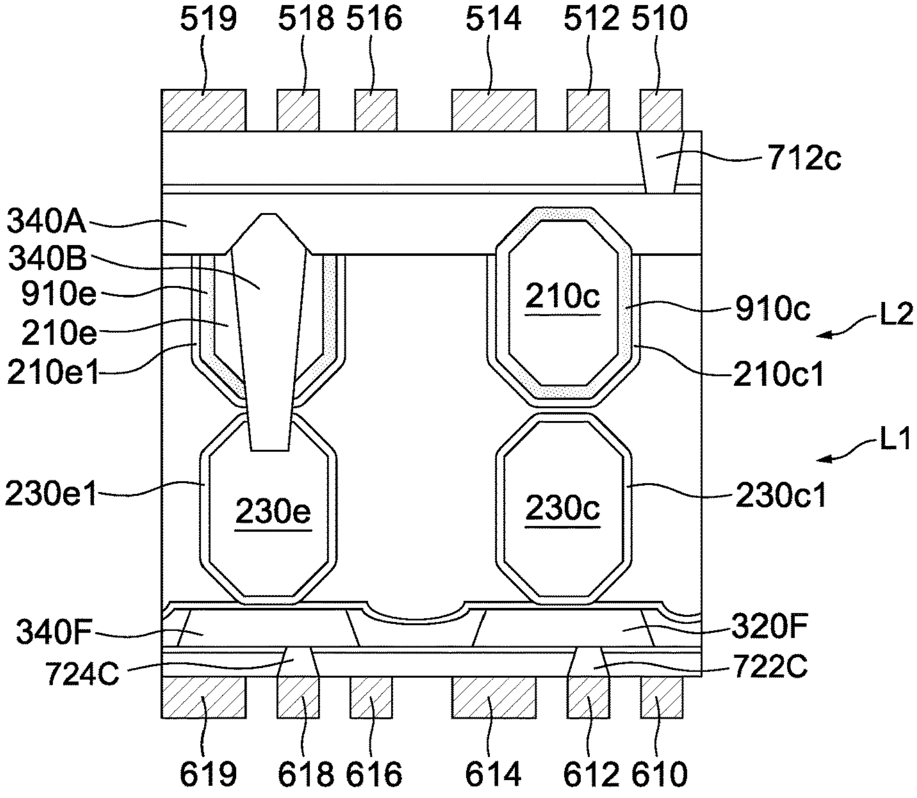
FIG. 17C is a cross-sectional view of a portion of a semiconductor device in accordance with some embodiments of the present disclosure.

FIG. 17A is a top view of a semiconductor device 5 in accordance with some embodiments of the present disclosure. FIG. 17B is a cross-sectional view of a portion of a semiconductor device 5 in accordance with some embodiments of the present disclosure. FIG. 17C is a cross-sectional view of a portion of a semiconductor device 5 in accordance with some embodiments of the present disclosure. In some embodiments, FIG. 17B illustrates a cross-sectional view along the cross-sectional line 17B-17B' in FIG. 17A, and FIG. 17C illustrates a cross-sectional view along the cross-sectional line 17C-17C' in FIG. 17A. In some embodiments, FIG. 17A illustrates a top view of a lower layer L1 and a top view of an upper layer L2 of a portion of the semiconductor device 5. In some embodiments, the semiconductor device 5 is similar to the semiconductor device 1 in FIGS. 1A-1D and the semiconductor device 3 in FIGS. 15A-15E, with differences therebetween as follows. Descriptions of similar components are omitted.

Referring to FIGS. 17A-17C, the semiconductor device 3 may be a portion of a standard cell. The semiconductor device 3 may include at least a plurality of transistors at the upper layer L2 and the lower layer L1. The transistors at the same layer may have the same conductivity type. In some embodiments, the transistors at the upper layer L2 are n-type transistors, and the transistors at the lower layer L1 are p-type transistors, and vice versa.

Referring to FIGS. 17A-17C, the layout structure of the semiconductor device 5 may include at least active regions 210, 220, 230, and 240, contacts 310E, 330E, 340A, 340B, 340E, 350E, 360E, 370E, 310F, 320F, 330F, 340F, and 350F (also referred to as "source/drain (S/D) contacts"), a plurality of gates (e.g., at least gates 410E and 420E), conductive traces 510, 512, 514, 516, 518, 519, 610, 612, 614, 616, 618, and 619, conductive vias 711C, 712C, 713C, 714C, 715C, 716C, 717C, 721C, 722C, 723C, 724C, 725C, and 731C, an insulation structure 800, and a plurality of isolation layers (e.g., at least isolation layers 910*c* and 910*e*). In some embodiments, each of the contacts at the upper layer L2 (e.g., the contacts 310E, 330E, 340A, 340B, 340E, 350E, 360E, and 370E) is electrically connected to the conductive traces 510, 512, 514, 516, 518, and/or 519 through at least one conductive via (e.g., the conductive vias 711C, 712C, 713C, 714C, 715C, 716C, and/or 717C). In some embodiments, each of the contacts at the lower layer L1 (e.g., the contacts 310F, 320F, 330F, 340F, and/or 350F) is electrically connected to the conductive traces 610, 612, 614, 616, 618, and/or 619 through at least one conductive via (e.g., the conductive vias 721C, 722C, 723C, 724C, and/or 725C). In some embodiments, each of the gates (e.g., the gates 410E and/or 420E) is electrically connected to the conductive traces 510, 512, 514, 516, 518, and/or 519 through at least one conductive via (e.g., the conductive via 731C).

Referring to FIGS. 17A-17C, in some embodiments, the contact 340B penetrates and electrically connects the conductive segment 210*e* and the conductive segment 230*e*. In some embodiments, the contact 340B penetrates the isolation layer 910*e* and the spacer layers 210*e*1 and 230*e*1 to electrically connect the conductive segment 230*e*, the conductive segment 210*e*, and the contact 340A. In some embodiments, the conductive segment 230*e* is electrically connected to the gate 410E through the contact 320B, the contact 320A, the conductive via 712C, the conductive trace 510, and the conductive via 731C. In some embodiments, the semiconductor device 5 includes an inverter which includes a PMOS transistor having the conductive segment 230*e* and an NMOS transistor having the conductive segment 210*e* stacked over and coupled to the PMOS. In some embodiments, the contact 340A extends across the conductive segment 210*c* to electrically connect to the conductive via 712C. In some embodiments, the contact 340A is electrically isolated from the conductive segment 210*c*.

Figure 17D:
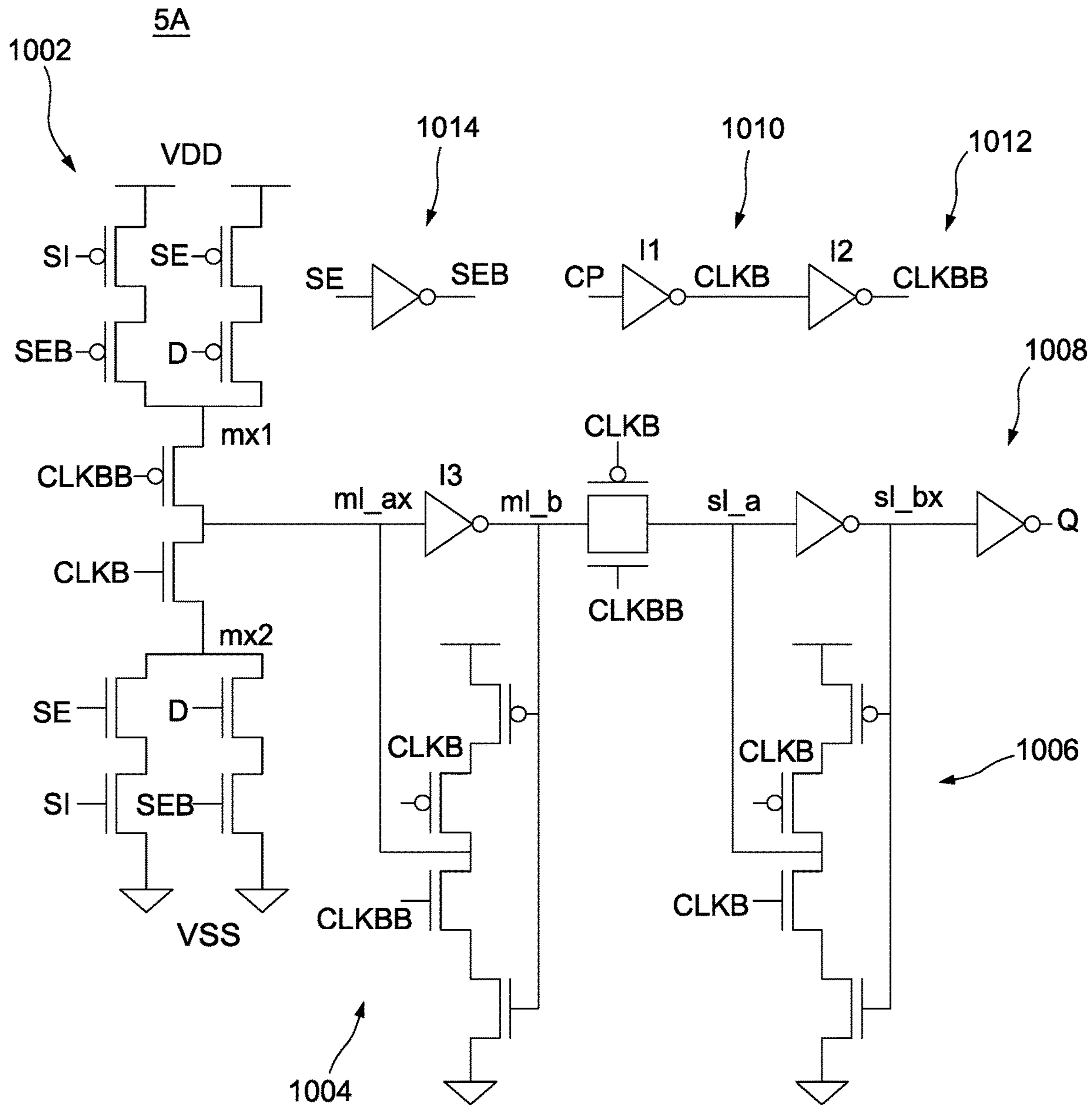
FIG. 17D illustrates a schematic view of a circuit in accordance with some embodiments of the present disclosure.

The structure in FIGS. 17A-17C may be applied to various integrated circuits/circuit cells to increasing routing flexibility. FIG. 17D illustrates a schematic view of a circuit 5A in accordance with some embodiments of the present disclosure. In some embodiments, at least an element of the circuit 5A illustrated in FIG. 17D may be implemented with at least a portion of the structure of the semiconductor device 5 illustrated in FIGS. 17A-17C.

Referring to FIG. 17D, in some embodiments, the circuit 5A is implemented as a flip flop circuit including a multiplexer 1002, a latch 1004, a latch 1006, an output circuit 1008, an inverter I1, an inverter I2, and an inverter 1014. The multiplexer 1002 includes two portions each including an input terminal configured to receive a signal D, an input terminal configured to receive a signal SI, and an input terminal configured to receive a selection signal SE or an inverted selection signal SEB. An output terminal of the multiplexer 1002 is coupled to an input terminal of the latch 1004. The multiplexer 1002 is configured to output a multiplexed signal to the latch 1004. An output terminal of the latch 1004 is coupled to an input terminal of the latch 1006. The latch 1004 is configured to output a signal to the latch 1006 by the output terminal. In some embodiments, the latch 1004 is coupled to the inverter I1, and is configured to receive a signal CLKB. In some embodiments, the latch 1004 is coupled to the inverter I2, and is configured to receive a signal CLKBB. The latch 1006 is coupled to the latch 1004 and the output circuit 1008. The input terminal of the latch 1006 is configured to receive a signal S2 from the latch 1004. The latch 1006 is configured to output a signal to the output circuit 1008 by the output terminal. In some embodiments, the latch 1006 is coupled to the inverter I1, and is configured to receive the signal CLKB. In some embodiments, the latch 1006 is coupled to the inverter I2, and is configured to receive the signal CLKBB. An output terminal of the output circuit 1008 is configured to output the output signal Q). In some embodiments, a transmission gate including an NMOX transistor and a PMOS transistor coupled together is configured to output a signal to an inverter 13. In some embodiments, at least the inverters of the circuit 5A may be implemented with the structures of the semiconductor device 5 illustrated in FIGS. 17A-17C.

According to an embodiment, a semiconductor device includes a first transistor, a second transistor, a third transistor, and a contact. The first transistor includes a first source/drain (S/D), a second S/D, and a first gate between the first S/D and the second S/D. The first transistor and the second transistor are stacked over the third transistor. The contact covers the second S/D of the first transistor. The contact is electrically connected to the second transistor and electrically isolated from the second S/D.

According to an embodiment, a semiconductor device includes a first transistor, a second transistor, a conductive trace, and a contact. The first transistor includes a first S/D, a second S/D, and a first gate between the first S/D and the second S/D. The second transistor is stacked directly under the first transistor. The conductive trace is over the first transistor. The contact covers the second S/D of the first transistor. The contact is electrically connected to the conductive trace and electrically isolated from the second S/D.

According to an embodiment, a method of manufacturing a semiconductor device includes: forming a first transistor stacked over a second transistor, the first transistor comprising a first S/D, a second S/D, and a first gate between the first S/D and the second S/D; forming a contact on the second S/D, the contact covering and electrically isolated from the second S/D of the first transistor; and forming a conductive trace over the first transistor and electrically connected to the contact.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:

a first transistor comprising a first source/drain (S/D), a second S/D, and a first gate between the first S/D and the second S/D;

a second transistor;

a third transistor, wherein the first transistor and the second transistor are stacked over the third transistor;

a first contact covering the second S/D of the first transistor, wherein the first contact is electrically connected to the second transistor and electrically isolated from the second S/D; and an isolation layer entirely covering a circumferential surface of the second S/D of the first transistor and electrically isolating the first contact from the second S/D;

wherein the second S/D of the first transistor is laterally and vertically surrounded by the first contact with the isolation layer therebetween; and wherein the second S/D is a shared S/D between the first transistor and the second transistor.

2. The semiconductor device according to claim 1, further comprising a conductive trace over the first transistor, a first via directly over the first contact, a second contact, and a second via between the conductive trace and the second contact, wherein the first contact is electrically connected to the second contact through the first via, the conductive trace, and the second via.

3. The semiconductor device according to claim 1, wherein the third transistor comprises a third S/D stacked directly under the second S/D, and the first contact electrically connects the third S/D of the third transistor to a fourth S/D of the second transistor.

4. The semiconductor device according to claim 3, wherein the first contact directly contacts a portion of the third S/D of the third transistor.

5. The semiconductor device according to claim 1, wherein the first contact directly contacts a circumferential surface of the isolation layer.

6. The semiconductor device according to claim 1, wherein the first transistor and the second transistor have the same conductivity type, and the first transistor and the third transistor have opposite conductive types.

7. The semiconductor device according to claim 1, wherein the second transistor comprises a second gate, wherein a top surface of the second gate is flush with a top surface of the first gate, and a thickness of the second gate is different from a thickness of the first gate.

8. A semiconductor device, comprising:

a first transistor comprising a first S/D, a second S/D, and a first gate between the first S/D and the second S/D;

a second transistor stacked directly under the first transistor and comprising a third S/D directly under the second S/D of the first transistor;

a third transistor stacked over the second transistor;

a conductive trace over the first transistor; and a contact covering the second S/D of the first transistor, wherein the contact is electrically connected to the conductive trace and electrically isolated from the second S/D, and the contact comprises a first extension between a bottom surface of the second S/D and a top surface of the third S/D;

wherein the second S/D of the first transistor is laterally and vertically surrounded by the contact; and wherein the second S/D is a shared S/D between the first transistor and the third transistor.

9. The semiconductor device according to claim 8, wherein the contact further comprises a second extension covering a top surface and two lateral surfaces of the second S/D.

10. The semiconductor device according to claim 8, wherein the second transistor further comprises a fourth S/D directly under the first S/D and a second gate between the third S/D and the fourth S/D, wherein the contact is electrically connected to the third S/D of the second transistor.

11. The semiconductor device according to claim 10, wherein the third transistor comprises a fifth S/D electrically connected to the third S/D of the second transistor through the conductive trace and the contact.

12. The semiconductor device according to claim 11, wherein the third transistor is offset from the second transistor from a top view perspective.

13. The semiconductor device according to claim 10, wherein the contact is conformally formed on an entire top surface of the third S/D of the second transistor.

14. The semiconductor device according to claim 8, further comprising an isolation layer between and directly contacting the contact and the second S/D of the first transistor.

15. A semiconductor device, comprising:

a first transistor comprising a first S/D, a second S/D, and a first gate between the first S/D and the second S/D;

a second transistor stacked directly under the first transistor;

a third transistor stacked over the second transistor and comprising a third S/D;

a conductive trace over the first transistor; and a first contact covering the second S/D of the first transistor, wherein the first contact is electrically isolated from the second S/D, and the first contact is electrically connected to the third S/D of the third transistor through the conductive trace;

wherein the second S/D of the first transistor is laterally and vertically surrounded by the first contact;

wherein the second transistor comprises a fourth S/D directly under the second S/D, the fourth S/D comprises a conductive layer and a spacer layer covering the conductive layer, the spacer layer has an opening exposing a portion of the conductive layer, and the portion of the conductive layer is protruding out of the opening of the spacer layer and extending into a recess of the first contact; and wherein the second S/D is a shared S/D between the first transistor and the third transistor.

16. The semiconductor device according to claim 15, further comprising a first via directly over the first contact, a second contact, and a second via between the conductive trace and the second contact, and the first contact is electrically connected to the second contact through the first via, the conductive trace, and the second via.

17. The semiconductor device according to claim 16, wherein the first contact tapers smoothly in a direction away from the first via, a thickness of the first contact is greater than a thickness of the second contact, and a thickness of the first via is substantially the same as a thickness of the second via.

18. The semiconductor device according to claim 15, further comprising an isolation layer covering a circumferential surface of the second S/D and contacting the first contact.

19. The semiconductor device according to claim 15, wherein the first contact directly contacts the portion of the conductive layer.

20. The semiconductor device according to claim 19, wherein the first contact is conformally formed on an entire top surface of the conductive layer of the fourth S/D.

* * * * *